United States Patent
Gronbeck et al.

(10) Patent No.: US 6,803,171 B2
(45) Date of Patent: Oct. 12, 2004

(54) PHOTOIMAGEABLE COMPOSITION

(75) Inventors: Dana A. Gronbeck, Holliston, MA (US); George G. Barclay, Jefferson, MA (US); Leo L. Linehan, Grafton, MA (US); Kao Xiong, Fitchburg, MA (US); Subbareddy Kanagasabapathy, Shrewsbury, MA (US)

(73) Assignee: Shipley Company L.L.C., Marlborough, MA (US)

( * ) Notice: Subject to any disclaimer, the term of this patent is extended or adjusted under 35 U.S.C. 154(b) by 202 days.

(21) Appl. No.: 10/140,761

(22) Filed: May 8, 2002

(65) Prior Publication Data

US 2003/0099899 A1 May 29, 2003

Related U.S. Application Data

(60) Provisional application No. 60/289,368, filed on May 8, 2001.

(51) Int. Cl.[7] .......................... G03C 1/73; G03C 1/795; G03F 7/039; G03F 7/30; G03F 7/40
(52) U.S. Cl. .................... 430/270.1; 430/311; 430/313; 430/326; 430/271.1; 430/286.1; 430/287.1; 430/905; 430/907; 430/909; 430/910; 430/914
(58) Field of Search .............................. 430/270.1, 326, 430/271.1, 286.1, 287.1, 905, 907, 909, 910, 914, 311, 313

(56) References Cited

U.S. PATENT DOCUMENTS

| | | | |
|---|---|---|---|
| 3,969,543 A | 7/1976 | Roberts et al. | 430/325 |
| 4,745,169 A | 5/1988 | Sugiyama et al. | 528/43 |
| 5,100,503 A | 3/1992 | Allman et al. | 156/643 |
| 5,240,813 A | 8/1993 | Watanabe et al. | 430/280 |
| 5,547,808 A | 8/1996 | Watanabe | 430/176 |
| 5,612,170 A | 3/1997 | Takemura et al. | 430/270.1 |
| 5,691,396 A | 11/1997 | Takemura et al. | 522/62 |
| 5,731,126 A | 3/1998 | Takemura et al. | 430/270.1 |
| 5,882,844 A | 3/1999 | Tsuchiya et al. | 430/288.1 |
| 5,972,560 A | 10/1999 | Kaneko et al. | 430/270.1 |
| 6,087,064 A | 7/2000 | Lin et al. | 430/270.1 |
| 6,114,085 A * | 9/2000 | Padmanaban et al. | 430/270.1 |
| 6,210,856 B1 | 4/2001 | Lin et al. | 430/270.1 |
| 6,309,796 B1 | 10/2001 | Nakashima et al. | 430/287.1 |
| 6,342,562 B1 | 1/2002 | Kozawa et al. | 524/588 |
| 6,420,084 B1 | 7/2002 | Angelopoulos et al. | 430/270.1 |
| 6,420,088 B1 | 7/2002 | Angelopoulos et al. | 430/272.1 |

* cited by examiner

*Primary Examiner*—Mark F. Huff
*Assistant Examiner*—Sin J. Lee
(74) *Attorney, Agent, or Firm*—Peter F. Corless; Darryl P. Frickey; Edwards & Angell, LLP

(57) ABSTRACT

Disclosed are photoimageable compositions containing silsesquioxane binder polymers and photoactive compounds, methods of forming relief images using such compositions and methods of manufacturing electronic devices using such compositions. Such compositions are useful as photoresists and in the manufacture of optoelectronic devices.

20 Claims, 1 Drawing Sheet

FIGURE
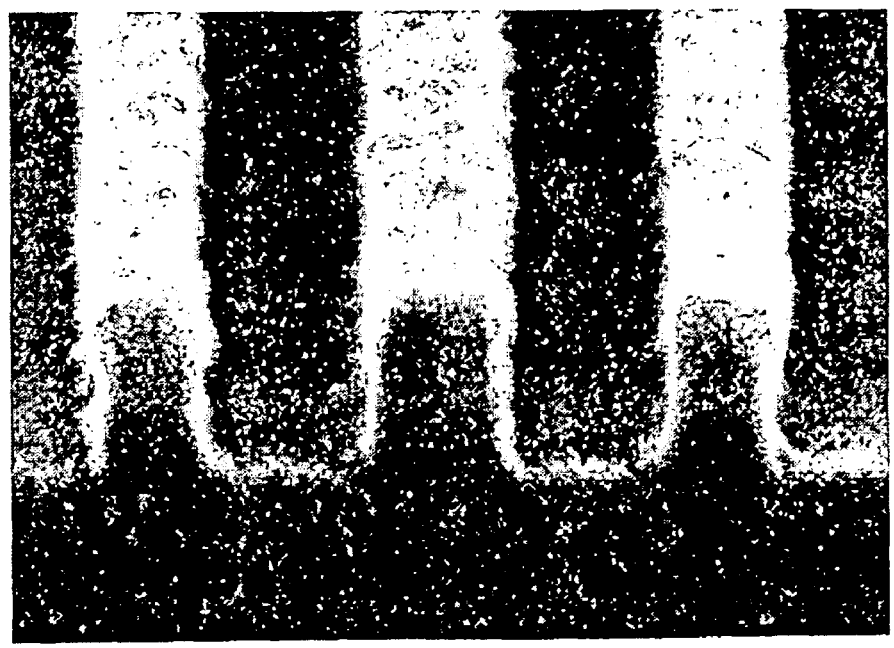

US 6,803,171 B2

PHOTOIMAGEABLE COMPOSITION

The present application claims the benefit of U.S. provisional application No. 60/289,368, filed on May 8, 2001, which is incorporated by reference herein in its entirety.

BACKGROUND

The present invention relates generally to photoimageable compositions. In particular, the present invention relates to photoimageable silsesquioxane compositions.

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable agents of the photoresist composition. Consequently, the exposed coating portions are rendered less soluble in a developer solution than unexposed portions. For positive-acting photoresists, exposed portions are rendered more soluble in a developer solution while areas not exposed remain comparatively less developer soluble. In general, photoresist compositions include at least a resin binder component and a photoactive agent.

More recently, chemically-amplified type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups comprising a photoresist binder backbone. See, for example, U.S. Pat. Nos. 5,075,199; 4,968,581; 4,810,613; and 4,491,628 and Canadian Patent Application 2,001,384. Upon cleavage of the blocking group through exposure of a coating layer of such a resist, a polar functional group is formed, e.g. carboxyl or imide, which results in different solubility characteristics in exposed and unexposed areas of the resist coating layer. See also R. D. Allen et al. *Proceedings of SPIE*, 2724:334–343 (1996); and P. Trefonas et al. *Proceedings of the 11th International Conference on Photopolymers* (*Soc. of Plastics Engineers*), pp 44–58 (Oct. 6, 1997).

The increasing density of integrated circuits has created a need for higher resolution patterning capabilities. One method of improving resolution involves using a shorter wavelength light during pattern formation. Shorter wavelengths of approximately 200 to 280 nm may be obtained by using a deep UV ("DUV") source such as a mercury/xenon ("Hg/Xe") lamp with appropriate filters. Additionally, KrF (248 nm) or ArF (193 nm) excimer lasers may be used as exposure sources. However, at shorter wavelengths the depth of focus of the exposure tool, which may be an excimer stepper, or step and scan tool, may be adversely affected. The depth of focus ("DOF") is an expression of the range of distances from the image focal plane through which the projected image remains in subjectively acceptable focus. DOF is related to wavelength and lens numerical aperture according to the formula: DOF $\alpha \lambda/2(NA)^2$ where $\lambda$ is the wavelength of exposing light and NA is the numerical aperture of the lens. Generally, a depth of focus of 1 to 2 $\mu$m is required for an adequate lithographic process window, in order to accommodate variations in the thickness or height of the resist film.

In addition to using shorter wavelengths during exposure, it is also desirable to use a thinner layer of resist. However, the major drawback of using a thin layer of resist is that the variation of resist thickness over a diffusion step on a substrate and into an etched pattern increases as the pattern size becomes smaller. This variation means that the dimensions of any pattern being imaged in the resist will vary as the step geometry is traversed. Therefore, in a single layer resist system, the lack of dimensional control on the wafer can create different line widths throughout the resist which reduces the quality of the electronic package.

To improve dimensional control, bilayer (or bilevel or multilevel) resist systems are often utilized. In a typical bilevel system, a bottom resist is first applied to a substrate to planarize wafer topography. The bottom resist is cured and a second thinner imaging top resist is then applied over the bottom resist. The top resist is then soft baked, and patterned (or imaged) using conventional resist exposure and development, followed by etch transfer of the top pattern through the bottom resist using the top resist pattern as an etch mask. Positive resists are commonly used in bilayer applications and are typically based on novolac resins, which are condensation polymers of phenols or substituted phenols and formaldehyde.

Sugiyama et al., *Positive Excimer Laser Resists Prepared with Aliphatic Diazoketones, Soc. Plastics Eng., Conference Proceedings*, pages 51–60 (November 1988), disclose a new class of alkali-developable positive excimer laser resists designed for DUV lithography. Such resists are two-component resists and contain $\alpha$-diazoacetoacetates blended with polyhydroxybenzylsilsesquioxane as a matrix resin.

U.S. Pat. No. 4,745,169 (Sugiyama et al.) discloses silicon-containing polymers for use in bilayer resist applications. The base soluble silsesquioxane polymer is synthesized by reacting trimethylsilyl iodide with polymethoxybenzyl-silsesquioxane to form aryl-O-trimethyl silyl groups. These trimethyl silyl groups are then hydrolyzed in water to form hydroxy groups. However, this reaction is not highly reproducible and often gives crosslinked polymer. Moreover, when these polymers are combined with diazonaphthoquinone-based photoactive compounds, exposure doses of >100 mJ/cm$^2$ at 365 nm are required to pattern the resist. Resists containing such photoactive compounds are too optically dense in the 200 to 280 nm region to be practical for DUV lithography. The optical density is greater than 0.5 for a 0.3 $\mu$m film of 20% photoactive compound in any polymer and the imaging dose is greater than 50 mJ/cm$^2$ in the DUV range. The optical density should be less than 0.3 or 0.4 $\mu$m for a single layer resist film in order to provide the most vertical wall profiles. For thinner films in a bilayer system the optical density should typically be less than or equal to 0.3 for a 0.3 to 0.4 $\mu$m film.

U.S. Pat. No. 5,338,818 (Brunsvold et al.) discloses certain acid sensitive polymers suitable for use in bilayer resist systems. Such polymers are copolymers of hydroxyphenyl- or hydroxybenzyl-silsesquioxane/RO-phenyl- or RO-benzyl-silsesquioxane, where R is selected from certain acid sensitive groups.

Conventional silicon-containing polymers, such as the above discussed silsesquioxane polymers, for use in bilayer resist systems have dissolution rates that are too high. Such high dissolution rates can negatively affect the lithographic performance of such bilayer resist systems. Such dissolution rate may be controlled by increasing the amount of blocking (or acid cleavable) groups in a positive photoresist system. However, such increased amount of blocking results in slower photospeeds and a reduced percentage of silicon in the resist. Such reduced silicon content may adversely affect the etch resistance of the resist.

There is thus a need for polymers suitable for use in bilayer resists that have controlled and/or lower dissolution rates than conventional bilayer resist polymers, with little or no loss of photospeed.

SUMMARY OF THE INVENTION

It has been surprisingly found that the present silsesquioxane-containing polymers are suitable for use in bilayer resist systems and have lower dissolution rates than conventional silsesquioxane polymers. It has been further found that the present polymers have improved lithographic performance as compared to such conventional bilayer silsesquioxane polymers.

In a first preferred aspect of the invention, a silicon copolymer is provided that comprises phenyl groups and includes at least the following three repeating units 1) units that contain photoacid-labile groups; 2) units that are free of photoacid-labile and aqueous developing groups; and 3) units that contribute to the aqueous, alkaline developability of a photoresist containing the polymer. Such polymers are particularly useful in chemically-amplified positive acting photoresists (resist has acid-labile groups undergo a cleavage or deblocking reaction in the presence of photoacid during lithographic processing).

In such copolymers, preferred photoacid-labile groups include photoacid-labile esters or acetal groups, such as may be grafted onto phenolic —OH groups. For instance, an ester grafted onto a hydroxy group is a preferred acid-labile group (de-esterification occurs in the presence of photogenerated acid to provide developer-soublizing carboxy group). Such esters may be provided e.g. by reaction of a haloacetate compound (e.g. tert-butyl chloroacetate) with a phenolic hydroxy group. Acetal groups also are preferred photoacid-labile groups; for example a vinyl ether compound may be grafted onto a phenolic hydroxy moiety to provide a photoacid-labile acetal group. Suitable vinyl ether reagents to provide a photoacid-labile acetal group include compounds having at least one —(CH=CH)—O— group such as ethylvinyl ether and the like.

Preferred repeat units that can contribute to aqueous developability of a photoresist containing the polymer include hydroxy, carboxy and other polar preferably acidic groups such as sulfonic acid and the like. For instance, a preferred repeat unit of this type is a phenolic unit, or other hydroxy-containing unit.

In such copolymers, units that are free of photoacid-labile and aqueous, alkaline developing groups will be free of moieties as discussed above, i.e. photoacid-labile ester or acetal moieties, or hydroxy, carboxy or sulfonic acid moieties. Preferred repeat units of this type include phenyl or alkyl groups that are not substituted with such photoacid-labile or aqueous, alkaline developing moieties, e.g. alkyl or phenyl groups that are either unsubstituted or substituted by one or more halo, unsubstituted alkyl, non-photoacid labile alkoxy, mesyl groups or other sulfonic esters such as those of the formula $C_{1-8}$alkylSO$_3$— and the like.

In such polymers, phenyl groups are preferably pendant to a polymer backbone that comprises linked Si groups or more preferably linked SiO groups.

A particularly preferred copolymer for use in photoimageable compositions of the invention includes Si atoms, with repeat units comprising i) phenol, ii) phenyl groups that comprise photoacid-labile moieties, and iii) phenyl groups that are either unsubstituted or substituted by groups that are other than photoacid-labile groups or aqueous, alkaline developing groups, such as sulfonyl acid esters, halogen, alkyl, etc. Preferably, with such polymers, the phenyl groups of units i), ii) and iii) are pendant groups and the polymer backbone comprises linked Si or SiO groups.

In a further aspect of the invention, photoimageable compositions are provided that include a polymer component and a photoactive component, wherein the component comprises a resin that includes as polymerized units one or more monomers of formula I and one or more monomers of formula II

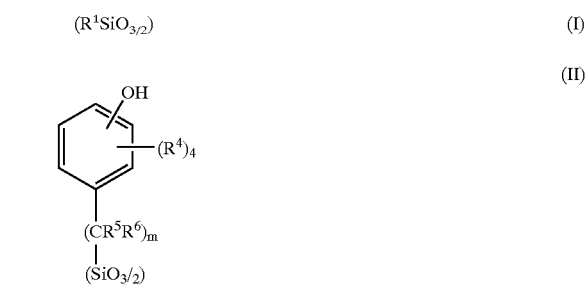

wherein $R^1$ is selected from $(C_1–C_{12})$alkyl, substituted $(C_1–C_{12})$alkyl, $(C_2–C_6)$alkenyl, substituted $(C_2–C_6)$alkenyl, phenyl, $C_6(R^7)_5$, $(C_1–C_5)$alkyl$(C_6(R^7)_4)$, $(C_1–C_5)$alkyl $(C_6H_4OZ)$, vinyl and substituted vinyl; Z is selected from $(C_1–C_6)$alkylsulfonate ester or arylsulfonate ester; each $R^7$ is independently selected from H, F, $(C_1–C_6)$alkyl, $(C_1–C_6)$ alkoxy, halo$(C_1–C_6)$alkyl, hydroxy-halo$(C_1–C_6)$alkyl or halo$(C_1–C_6)$alkoxy; each $R^4$ is independently selected from $R^7$ and OH; each $R^5$ is independently selected from H or F; each $R^6$ is independently selected from H, F, $CH_3$, $CF_3$, $CHF_2$, and $CH_2F$; and m=0–2.

In another aspect, the present invention provides a method of forming a relief image including the steps of depositing a photoimageable composition on a substrate and imaging the photoimageable composition through a mask to provide a relief image, wherein the photoimageable composition includes a binder polymer and a photoactive component, wherein the binder polymer includes as polymerized units one or more monomers of formula I and one or more monomers of formula II $(R^1SiO_{3/2})$                (I)

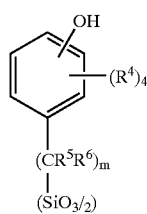

(II)

wherein $R^1$ is selected from $(C_1–C_{12})$alkyl, substituted $(C_1–C_{12})$alkyl, $(C_2–C_6)$alkenyl, substituted $(C_2–C_6)$alkenyl, phenyl, $C_6(R^7)_5$, $(C_1–C_5)$alkyl$(C_6(R^7)_4)$, $(C_1–C_5)$alkyl $(C_6H_4OZ)$, vinyl and substituted vinyl; Z is selected from $(C_1–C_6)$alkylsulfonate ester or arylsulfonate ester; each $R^7$ is independently selected from H, F, $(C_1–C_6)$alkyl, $(C_1–C_6)$alkoxy, halo$(C_1–C_6)$alkyl, hydroxy-halo$(C_1–C_6)$alkyl or halo$(C_1–C_6)$alkoxy; each $R^4$ is independently selected from $R^7$ and OH; each $R^5$ is independently selected from H or F; each $R^6$ is independently selected from H, F, $CH_3$, $CF_3$, $CHF_2$, and $CH_2F$; and m=0–2.

In a further aspect, the present invention provides a method of manufacturing an electronic device including the steps of disposing on an electronic device substrate a photoimageable composition including a binder polymer and a photoactive component, wherein the binder polymer includes as polymerized units one or more monomers of formula I and one or more monomers of formula II $(R^1SiO_{3/2})$ (I)

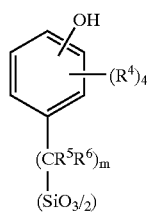

(II)

wherein $R^1$ is selected from $(C_1–C_{12})$alkyl, substituted $(C_1–C_{12})$alkyl, $(C_2–C_6)$alkenyl, substituted $(C_2–C_6)$alkenyl, phenyl, $C_6(R^7)_5$, $(C_1–C_5)$alkyl$(C_6(R^7)_4)$, $(C_1–C_5)$alkyl $(C_6H_4OZ)$, vinyl and substituted vinyl; Z is selected from $(C_1–C_6)$alkylsulfonate ester or arylsulfonate ester; each $R^7$ is independently selected from H, F, $(C_1–C_6)$alkyl, $(C_1–C_6)$alkoxy, halo$(C_1–C_6)$alkyl, hydroxy-halo$(C_1–C_6)$alkyl or halo$(C_1–C_6)$alkoxy; each $R^4$ is independently selected from $R^7$ and OH; each $R_5$ is independently selected from H or F; each $R^6$ is independently selected from H, F, $CH_3$, $CF_3$, $CHF_2$, and $CH_2F$; and m=0–2; imaging the photoimageable composition through a mask; and developing the photoimageable composition.

In yet a further aspect, the present invention provides a photoimageable composition including a binder polymer and a photoactive component, wherein the binder polymer includes as polymerized units one or more monomers of formula I, one or more monomers of formula II and one or more monomers of formula III $(R^1SiO_{3/2})$ (I)

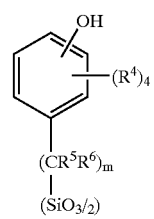

(II)

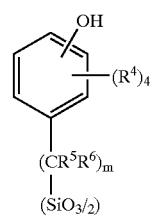

(III)

wherein $R^1$ is selected from $(C_1–C_{12})$alkyl, substituted $(C_1–C_{12})$alkyl, $(C_2–C_6)$alkenyl, substituted $(C_2–C_6)$alkenyl, phenyl, $C_6(R^7)_5$, $(C_1–C_5)$alkyl$(C_6(R^7)_4)$, $(C_1–C_5)$alkyl $(C_6H_4OZ)$, vinyl and substituted vinyl; Z is selected from $(C_1–C_6)$alkylsulfonate ester or arylsulfonate ester; $R^2$ is an acid cleavable group; each $R^7$ and $R^8$ is independently selected from H, F, $(C_1–C_6)$alkyl, $(C_1–C_6)$alkoxy, halo $(C_1–C_6)$alkyl, hydroxy-halo$(C_1–C_6)$alkyl or halo$(C_1–C_6)$ alkoxy; each $R^4$ is independently selected from $R^7$ and OH; each $R^5$ and $R^9$ is independently selected from H or F; each $R^6$ and $R^{10}$ is independently selected from H, F, $CH_3$, $CF_3$, $CHF_2$, and $CH_2F$; m=0–2; and p=0–2.

In yet another aspect, the present invention provides a method of forming a relief image including the steps of depositing a photoimageable composition on a substrate and imaging the photoimageable composition through a mask to provide a relief image, wherein the photoimageable composition includes a binder polymer and a photoactive component, wherein the binder polymer includes as polymerized units one or more monomers of formula I, one or more monomers of formula II and one or more monomers of formula III $(R^1SiO_{3/2})$ (I)

(II)

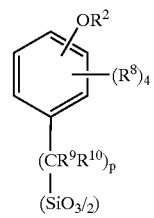

(III)

wherein $R^1$ is selected from $(C_1–C_{12})$alkyl, substituted $(C_1–C_{12})$alkyl, $(C_2–C_6)$alkenyl, substituted $(C_2–C_6)$alkenyl, phenyl, $C_6(R^7)_5$, $(C_1–C_5)$alkyl$(C_6(R^7)_4)$, $(C_1–C_5)$alkyl $(C_6H_4OZ)$, vinyl and substituted vinyl; Z is selected from (C1–C6)alkylsulfonate ester or arylsulfonate ester; $R^2$ is an acid cleavable group; each $R^7$ and $R^8$ is independently selected from H, F, $(C_1-C_6)$alkyl, $(C_1-C_6)$alkoxy, halo$(C_1-C_6)$alkyl, hydroxy-halo$(C_1-C_6)$alkyl or halo$(C_1-C_6)$alkoxy; each $R^4$ is independently selected from $R^7$ and OH; each $R^5$ and $R^9$ is independently selected from H or F; each $R^6$ and $R^{10}$ is independently selected from H, F, $CH_3$, $CF_3$, $CHF_2$, and $CH_2F$; m=0–2; and p=0–2.

In still another aspect, the present invention provides a method of manufacturing an electronic device including the steps of disposing on an electronic device substrate a photoimageable composition including a binder polymer and a photoactive component, wherein the binder polymer includes as polymerized units one or more monomers of formula I, one or more monomers of formula II and one or more monomers of formula III $$(R^1SiO_{3/2}) \qquad (I)$$

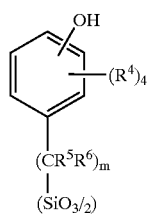

(II)

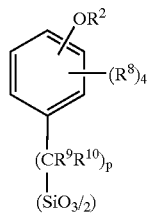

(III)

wherein $R^1$ is selected from $(C_1-C_{12})$alkyl, substituted $(C_1-C_{12})$alkyl, $(C_2-C_6)$alkenyl, substituted $(C_2-C_6)$alkenyl, phenyl, $C_6(R^7)_5$, $(C_1-C_5)$alkyl$(C_6(R^7)_4)$, $(C_{1-C5})$alkyl $(C_6H_4OZ)$, vinyl and substituted vinyl; Z is selected from (C1–C6)alkysulfonate ester or arylsulfonate ester; $R^2$ is an acid cleavable group; each $R^7$ and $R^8$ is independently selected from H, F, $(C_1-C_6)$alkyl, $(C_1-C_6)$alkoxy, halo$(C_1-C_6)$alkyl, hydroxy-halo$(C_1-C_6)$alkyl or halo$(C_1-C_6)$alkoxy; each $R^4$ is independently selected from $R^7$ and OH; each $R^5$ and $R^9$ is independently selected from H or F; each $R^6$ and $R^{10}$ is independently selected from H, F, $CH_3$, $CF_3$, $CHF_2$, and $CH_2F$; m=0–2; and p=0–2; imaging the photoimageable composition through a mask; and developing the photoimageable composition.

In a still further aspect, the present invention provides a polymer including as polymerized units one or more monomers of formula I and one or more monomers of formula II $$(R^1SiO_{3/2}) \qquad (I)$$

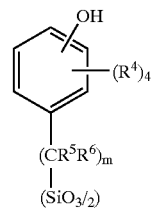

(II)

wherein $R^1$ is selected from $(C_1-C_{12})$alkyl, substituted $(C_1-C_{12})$alkyl, $(C_2-C_6)$alkenyl, substituted $(C_2-C_6)$alkenyl, phenyl, $C_6(R^7)_5$, $(C_1-C_5)$alkyl$(C_6(R^7)_4)$, $(C_{1-C5})$alkyl $(C_6H_4OZ)$, vinyl and substituted vinyl; Z is selected from $C_1-C_6$)alkyl, ester or arylsulfonate ester; each $R^7$ is independently selected from H, F, $(C_1-C_6)$alkyl, $(C_1-C_6)$alkoxy, halo$(C_1-C_6)$alkyl, hydroxy-halo$(C_1-C_6)$alkyl or halo $(C_1-C_6)$alkoxy; each $R^4$ is independently selected from $R^7$ and OH; each $R^5$ is independently selected from H or F; each $R^6$ is independently selected from H, F, $CH_3$, $CF_3$, $CHF_2$, and $CH_2F$; and m=0–2.

In an even further embodiment, the present invention provides an optical waveguide having a core and a cladding, wherein at least one of the core and cladding includes as polymerized units the polymer described above.

BRIEF DESCRIPTION OF THE DRAWINGS

The FIGURE is a scanning electron micrograph showing an imaged composition of the invention.

DETAILED DESCRIPTION OF THE INVENTION

As discussed above, in a first preferred aspect of the invention, we now provide a silicon copolymer (particularly terpolymer or higher order polymer) and photoresists containing the polymer, wherein the copolymer comprises phenyl groups and at least the following three distinct repeating units: 1) units that contain photoacid-labile groups; 2) units that are free of photoacid-labile and aqueous developing groups; and 3) units that contribute to the aqueous, alkaline developability of a photoresist containing the polymer.

Preferred photoacid-labile groups of such copolymers include photoacid-labile ester or acetal groups, such as may be grafted onto phenolic —OH groups.

For instance, as discussed above, a haloacetate reagent such as tert-butyl chloroacetate ($ClCH_2CO_2C(CH_3)_3$) may be reacted with a hydroxy moiety such as a phenolic hydroxy. A carbonate reagent also may be reacted with a hydroxy moiety to provide pendant photoacid-labile esters, e.g. di-tert-butyl dicarbonate ($O[CO_2C(CH_3)_2]_2$) may be reacted with phenolic groups or other polymer hydroxy groups to provide pendent acid-labile ester groups. Reactions of such haloacetate or dicarbonate reagents may be suitably conducted under either acidic or basic conditions such as in the presence of potassium t-butoxide or N,N-dimethylaminopyridine. Basic reaction conditions are generally preferred.

A vinyl ether compound also suitably may be grafted onto a phenolic hydroxy moiety to provide a photoacid-labile acetal group, e.g. a compound having at least one —(CH=CH)—O— groups such as ethylvinyl ether, t-amylvinyl ether, t-butylvinyl ether, vinylisobutyl vinyl ether, vinylpropyl ether, vinyl-2-ethylhexyl ether, vinyloctadecyl ether, and the like, as well as compounds that have two vinyl groups such as hydroxybutylvinyl ether, butanediol-1,4-divinyl ether, cyclohexylvinyl ether, hexanedioldivinyl ether, and the like, as well as compounds having three vinyl groups such triethyleneglycol divinyl ether, diethyleneglycol monovinyl ether, and the like, as well as compounds having 4 or more vinyl groups such as 1,4-cyclohexanoldimethanoldivinyl ether, propenyl ether of propylene carbonate, 1,1,1-tris(vinyloxymethyl)ethane, cyclohexanedimethanolmonovinyl ether, and the like.

Suitably, to provide acetal photoacid-labile groups, such vinyl ether compounds may be grafted onto a hydroxy group (e.g. a phenolic group or alcohol group such as $C_{1-12}$hydroxyalkyl) under acidic conditions preferably after dissolving the hydroxy-containing compound and the vinyl ether reagent in a suitable solvent such as one or more of acetone, tetrahydrofuran, diglyme and dioxane. Suitable acid catalysts to use to provide acidic conditions include hydrochloric acid, sulfuric acid, malonic acid and/or a sulfonic acid. Preferably, the molar ratio of free hydroxyl groups to the vinyl ether compound does not exceed 1 to 1, and more preferably the hydroxyl groups are present in a molar excess (e.g. 2:1) relative to the vinyl ether compound. In particular, a preferred synthesis includes grafting vinyl ether onto a preformed Si polymer having hydroxy groups, particularly phenolic groups, where only a portion of the phenolic groups are blocked with photoacid-labile groups and a portion of the phenolic hydroxy groups remain unblocked as aqueous, alkaline developable groups.

Preferred repeat units that can contribute to aqueous developability of a photoresist containing the polymer include hydroxy, carboxy and other polar preferably acidic groups such as sulfonic acid and the like. For instance, a preferred repeat unit of this type is a phenolic unit, or other hydroxy-containing unit.

In such copolymers, units that are free of photoacid-labile and aqueous, alkaline developing groups will be free of moieties as discussed above, i.e. photoacid-labile ester or acetal moieties, or hydroxy, carboxy or sulfonic acid moieties. Preferred repeat units of this type include phenyl or alkyl groups that are not substituted with such photoacid-labile or aqueous, alkaline developing moieties; e.g. preferred repeat units of this type are alkyl or phenyl groups that are either unsubstituted or substituted by one or more halo, unsubstituted alkyl, non-photoacid labile alkoxy, sulfonyl acid esters, and the like. Such substituents should be substantially stable (i.e. not undergoing a deblocking reaction) under typical lithographic conditions (e.g. pre-exposure thermal treatment of up to 140° C. for 1–2 minutes; exposure; post-exposure thermal treatment of up to about 160° C. for 1–2 minutes; and/or development with an aqueous, alkaline developer solution). Preferred substituents that are non-photoacid-labile and do not substantially promote aqueous developability useful for this type of repeat unit are disclosed as inert blocking groups in U.S. Pat. No. 5,736,536 and 5,541,263 both to Thackeray et al. of the Shipley Company. As disclosed in those patents, suitable substituents that are substantially inert to lithographic processing and do not substantially increase aqueous, alkaline developability of a resist containing the polymer include alkoxy groups such as methoxy, ethoxy, propoxy, n-butoxy, sec-butoxy, etc.; alkyl esters represented by RCOO— where R is preferably an alkyl group having 1 to 6 carbon atoms such as methyl, ethyl, propyl, isopropyl, butyl, etc.; sulfonyl acid esters include both alkyl (e.g. $C_{1-6}$ alkyl) are carbocyclic aryl esters such as methane sulfonyl, ethane sulfonyl, propane sulfonyl, benzene sulfonyl, and toluene sulfonyl esters, etc. All those groups can be grafted onto hydroxy groups as discussed above to form sulfonyl esters, e.g. by reaction of an alkylhalide such alkylchloride to form an alkoxy group, or an acid halide such as acid chloride to form an alkylester.

Such preferred Si polymers containing phenyl groups and the three distinct repeat can be readily prepared. For instance, a Si-phenyl reagent can be polymerized preferably a hydroxylbenzyl silyl reagent. A formed poly (hydroxybenzyl silsequioxane) can be functionalized to provide three distinct repeat units, e.g. the pendant phenol hydroxy groups can be reacted to have both photoacid-labile groups (such as by reaction of a dicarbonate or a halacetate ester as discussed above) and non-photoacid-labile groups such as provided by reaction of a sulfonyl acid or acid chloride or the like. Preferably, those distinct groups are reacted sequentially with the pre-formed hydroxy silsesquixane polymer, although it is possible to make both additions to the pre-formed polymer in a single reaction sequence. Preferably, a portion of the hydroxy moieties are left unreacted (i.e. unsubstituted) to provide aqueous, alkaline developing enhancing OH groups. See the examples which follow for particularly preferred reaction schemes, conditions and polymers.

In this preferred copolymer of the invention, the three distinct repeat units may be suitably present in a variety of relative amounts. For example, repeat units that have photoacid-labile groups suitably may be present in a polymer from about 1, 2 or 3 to about 60 or 70 mole percent, based on total repeat units of the polymer, more preferably about 5, 10 or 20 to about 30, 40 or 50 mole percent based on total units of the polymer. The repeat unit(s) that do not contain photoacid labile groups and do not substantially increase aqueous, alkaline developability (e.g. mesyl-substituted phenyl) suitably may be present in a polymer from about 1, 2 or 3 to about 50 or 60 mole percent, based on total repeat units of the polymer, more preferably about 5, 10 or 20 to about 30 or 40 or 50 mole percent based on total units of the polymer. The repeat units that increase aqueous, alkaline developability (sucvh as phenol units) suitably may be present in a polymer from about 5 to about 60 or 70 mole percent, based on total repeat units of the polymer, more preferably about 10, 20 or 25 to about 30, 40 or 50 mole percent based on total units of the polymer.

Photoimageable compositions of the invention are preferably used in multiple-layer systems, i.e. where the photoimageable composition is disposed over a further organic (polymer composition) layer that itself is disposed over a substrate surface such as a microelectronic wafer or device substrate or an optical waveguide substrate.

Preferred underlayer compositions include those that comprise a phenolic polymer such as a novolak and/or poly(vinylphenol). Also preferred is where the underlying polymer composition is a crosslinking composition, e.g. contain an acid or acid generator compound such as a thermal acid generator compound and preferably a separate crosslinker component such as an amine-based material, e.g. a melamine or benzoguanamine resin. For such crosslinking composition, the applied underlayer may be crosslinked prior to application of the overcoated photoimageable composition, e.g. by suitable thermal treatment such as heating at 140° C., 150° C., 160° C., 180° C., 200° C. or 230° C. for a time sufficient for crosslinking such as 0.5, 1 or 2 minutes. The underlying polymer composition is suitably non-photoimageable and does not contain a photoacid generator compound.

Particularly preferred photoimageable compositions of the invention include a binder polymer and a photoactive component, wherein the binder polymer includes as polymerized units one or more monomers of formula I and one or more monomers of formula II $(R^1SiO_{3/2})$ (I)

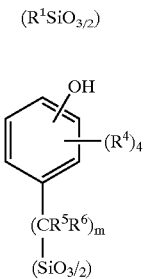 (II)

wherein $R^1$ is selected from $(C_1–C_{12})$alkyl, substituted $(C_1–C_{12})$alkyl, $(C_2–C_6)$alkenyl, substituted $(C_2–C_6)$alkenyl, phenyl, $C_6(R^7)_5$, $(C_1–C_5)$alkyl$(C_6(R^7)_4)$, $(C_1–C_5)$alkyl $(C_6H_4OZ)$, vinyl and substituted vinyl; Z is selected from $(C_1–C_6)$alkylsulfonate ester or arylsulfonate ester; each $R^7$ is independently selected from H, F, $(C_1–C_6)$alkyl, $(C_1–C_6)$ alkoxy, halo$(C_1–C_6)$alkyl, hydroxy-halo$(C_1–C_6)$alkyl or halo$(C_1–C_6)$alkoxy; each $R^4$ is independently selected from $R^7$ and OH; each $R^5$ is independently selected from H or F; each $R^6$ is independently selected from H, F, $CH_3$, $CF_3$, $CHF_2$, and $CH_2F$; and m=0–2. Also provided by the present invention is a polymer including as polymerized units one or more monomers of formula I and one or more monomers of formula II $(R^1SiO_{3/2})$ (I)

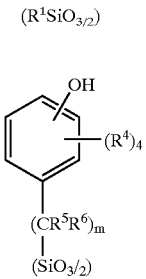 (II)

wherein $R^1$ is selected from $(C_1–C_{12})$alkyl, substituted $(C_1–C_{12})$alkyl, $(C_2–C_6)$alkenyl, substituted $(C_2–C_6)$alkenyl, phenyl, $C_6(R^7)_5$, $(C_1–C_5)$alkyl$(C_6(R^7)_4)$, $(C_1–C_5)$alkyl $(C_6H_4OZ)$, vinyl and substituted vinyl; Z is selected from $(C_1–C_6)$alkylsulfonate ester or arylsulfonate ester; each $R^7$ is independently selected from H, F, $(C_1–C_6)$alkyl, $(C_1–C_6)$ alkoxy, halo$(C_1–C_6)$alkyl, hydroxy-halo$(C_1–C_6)$alkyl or halo$(C_1–C_6)$alkoxy; each $R^4$ is independently selected from $R^7$ and OH; each $R^5$ is independently selected from H or F; each $R^6$ is independently selected from H, F, $CH_3$, $CF_3$, $CHF_2$, and $CH_2F$; and m=0–2. When m=0, it will be appreciated that there is a chemical bond between the silicon and the aromatic ring. It is preferred that m=0 or 1, and more preferably m=1. By "substituted alkyl" or "substituted alkenyl" it is meant that one or more hydrogens of the alkyl or alkenyl group, respectively, is replaced by one or more other substituents. Suitable substituents include, but are not limited to, $(C_1–C_6)$alkyl; substituted$(C_1–C_6)$alkyl; $(C_1–C_6)$ alkoxy; alkoxycarbonyls having the general formula $(R^2O—C(O))$— wherein $R^2$ is as defined herein below; halo; halo$(C_1–C_6)$alkyl such as trifluoromethyl; $(C_1–C_{10})$ alkylsulfonate; and arylsulfonate. Fluorine is a preferred halogen substituent. Preferred alkyl and substituted alkyl groups for $R^1$ are $(C_1–C_{10})$alkyl, substituted $(C_1–C_{10})$alkyl, and $(R^2O—C(O))$—$(C_1–C_{10})$alkyl, wherein $R^2$ is as defined herein below. Preferred substituted $(C_2–C_6)$alkenyl groups for $R^1$ are halo$(C_2–C_6)$alkenyl, and more preferably fluoro $(C_2–C_6)$alkenyl. When $R^1$ is a $(C_1–C_5)$alkyl$(C_6H_4OZ)$ group, as used herein, such Z is referred to as an alkylsulfonato or arylsulfonato substituent, or alternatively as alkylsulfonyloxy of arylsulfonyloxy substituent. The $(C_1–C_6)$ alkylsulfonate ester or arylsulfonate ester groups of Z may optionally be substituted, such as by halogen, and particularly fluorine. Suitable groups where $R^1$ is a $(C_1–C_5)$alkyl $(C_6H_4OZ)$ include, but are not limited to, phenylsulfonatobenzyl, phenylsulfonatophenylethyl, methylsulfonatobenzyl, ethylsulfonatobenzyl, propylsulfonatobenzyl, trifluoromethylsulfonatobenzyl, methylsulfonatophenylethyl, tolylsulfonatobenzyl, tolylsulfonatophenylethyl, camphorsulfonatobenzyl, camphorsulfonatophenylethyl, phenylsulfonatophenyl, methylsulfonatophenyl, tolylsulfonatophenyl, camphorsulfonatophenyl, ethysulfonatophenyl, propylsulfonatophenyl, trifluoromethylsulfonatophenyl, ethylsulfonatophenylethyl, propylsulfonatophenylethyl, trifluoromethylsulfonatophenylethyl, and the like. Other suitable groups for $R^1$ include, but are not limited to, methyl, ethyl, trifluoromethyl, 2,2,2-trifluoroethyl, pentafluoroethyl, phenyl, benzyl, phenethyl, tolyl, trifluoromethylphenyl, methoxyphenyl, trifluoromethoxyphenyl, norbornyl, cyclohexyl, 1,2,2-trifluorovinyl, and the like, and preferably methyl, ethyl, trifluoromethyl, 2,2,2-trifluoroethyl, pentafluoroethyl, phenyl, benzyl, phenethyl, tolyl, trifluoromethylphenyl, trifluoromethoxyphenyl, norbornyl, cyclohexyl, and 1,2,2-trifluorovinyl. Particularly suitable monomers of formula II include, but are not limited to, hydroxyphenyl, hydroxybenzyl and hydroxyphenylethyl. Suitable hydroxy-halo$(C_1–C_6)$alkyl groups for $R^7$ include, but are not limited to, —$C(CF_3)_2OH$.

The above described polymers are also provided by the present invention.

Photoimageable compositions may be negative-acting or positive-acting. As discussed above, when the present compositions are positive-acting, the polymers typically further include one or more monomers containing an acid sensitive or cleavable group. Such acid sensitive monomers include, but are not limited to, those of the formula III

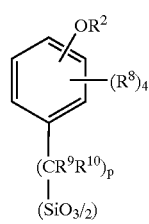 (III)

wherein $R^2$ is an acid cleavable group; each $R^8$ is independently selected from H, F, $(C_1–C_6)$alkyl, $(C_1–C_6)$alkoxy, halo$(C_1–C_6)$alkyl, hydroxy-halo$(C_1–C_6)$alkyl or halo $(C_1–C_6)$alkoxy; each $R^9$ is independently selected from H or F; each $R^{10}$ is independently selected from H, F, $CH_3$, $CF_3$, $CHF_2$, and $CH_2F$; and p=0–2. Preferably, p=0 or 1, and more preferably p=1. It is preferred that $R^3$ is ethyl, propyl or cyclohexyl. $R^2$ may be any suitable acid cleavable group. Suitable acid cleavable groups or leaving groups are typically those that readily or facilely form carbonium ions and include, but are not limited to: a) a group selected from —$C(O)OC(CH_3)_3$; —$CH(CH_3)O(C_1–C_6)$alkyl; —$CH_2C(O)$ $OC(CH_3)_3$; —$C_5H_8O$ ("tetrahydropyranyl") or lactones; b) an optionally substituted noncyclic alkyl moiety having 6 or more carbon atoms, with at least 2 carbon atoms selected from secondary, tertiary and quaternary carbon atoms, and wherein the ether oxygen is directly bonded to a quaternary carbon atom; c) optionally substituted fenchyl; d) optionally substituted phenyl; e) optionally substituted 3,2,0 bridged system; f) optionally substituted bridged heteroalicyclic group; g) optionally substituted cycloalkyl group having 3 or 4 ring carbon atoms; and h) optionally substituted 2,2,1-bridged systems. Suitable lactones include those attached to the oxygen by a tertiary carbon, such as γ-valerolactone.

Suitable noncyclic alkyl moieties as leaving groups include those that have one, two or more tertiary carbon atoms, and/or one, two or more quaternary carbons. References herein to a "secondary" carbon indicate the carbon atom has two non-hydrogen substituents (i.e. CH$_2$RR' where R and R' are the same or different and each is other than hydrogen); references herein to a "tertiary" carbon indicate the carbon atom has three non-hydrogen substituents (i.e. CHRR'R" where R, R' and R" are the same or different and each is other than hydrogen); and references herein to a "quaternary" carbon indicate the carbon atom has four non-hydrogen substituents (i.e. CRR'R"R''' where R, R', R" and R''' are each the same or different and each is other than hydrogen). See, for instance, Morrison and Boyd, Organic Chemistry, particularly at page 85 (3rd ed., Allyn and Bacon), for a discussion of those terms secondary, tertiary and quaternary. It is often preferred that a quaternary carbon is directly linked (i.e. covalently linked with no other interpose atoms) to the oxygen.

Preferred acid cleavable groups of the invention contain only saturated carbon atoms. Thus, e.g., in this preferred aspect of the invention, the groups R, R', R", R''' of the above formulae for secondary, tertiary and quaternary carbons of the groups (i.e. the formulae CH$_2$RR', CHRR'R", CRR'R"R''') are each saturated alkyl, typically (C$_1$–C$_{10}$) alkyl, more typically (C$_1$–C$_6$)alkyl, still more typically alkyl having 1, 2, 3 or 4 carbons. Preferred alkyl moieties include those having 1 quaternary carbon linked to the oxygen atom of the ether linkage and one or more additional tertiary or quaternary carbon atoms and not more than a one single ring alicyclic group. Additional preferred alkyl moieties include those having 1 quaternary carbon linked to the ether oxygen atom of the linkage and one or more additional secondary carbon atoms and no more than one ring alicyclic groups. Optimally, the ether group will contain only carbon and hydrogen atoms and be free of double or triple bonds. More preferred alkyl moieties include those having one quaternary carbon linked to the ether oxygen atom of the linkage and one or more additional quaternary or tertiary carbon atoms and not more than a one single ring alicyclic group. Optimally, the group will contain solely carbon and hydrogen atoms and be free of double or triple bonds. Particularly suitable leaving groups containing a quaternary carbon bonded directly to the oxygen include, but are not limited to, those having the structures of Formulae (IV)–(X), where refers to a polymer.

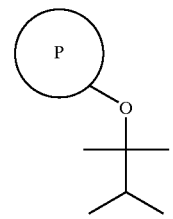

(IV)

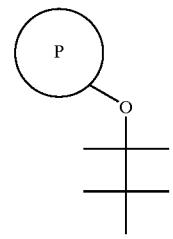

(V)

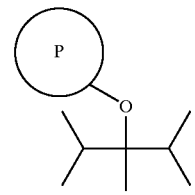

(VI)

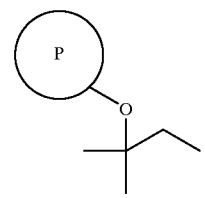

(VII)

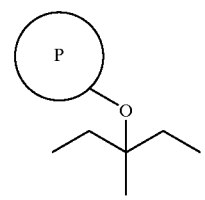

(VIII)

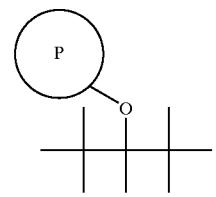

(IX)

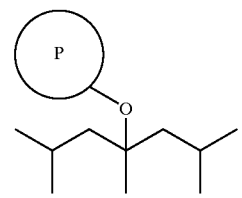

(X)

Particularly suitable leaving groups having a quaternary carbon bonded directly to the ether linkage include, but are not limited to, 2,3-dimethyl-2-butyl; 2,3,3-trimethyl-2-butyl; 2-methyl-2-butyl; 3-methyl-3-pentyl; 2,3,4-trimethyl-3-pentyl; 2,2,3,4,4-pentamethyl-3-pentyl; 1-methyl-1-cyclopentyl; 1,2-dimethyl-1-cyclopentyl; 1,2,5-trimethyl-1- cyclopentyl; 1,2,2-trimethyl-cyclopentyl; 2,2,5,5-tetramethyl-1-cyclopentyl; 1-methyl-1-cyclohexyl; 1,2-dimethyl-1-cyclohexyl; 1,2,6-trimethyl-1-cyclohexyl; 1,2,2,6-tetramethyl-1-cyclohexyl; 1,2,2,6,6-pentamethyl-1-cyclohexyl; and 2,4,6-trimethyl-4-heptyl.

Other suitable leaving groups useful in the present compositions include those that provide anchimeric assistance during acid-induced cleavage of the leaving groups. Such anchimeric assistance, also known as neighboring group participation, typically involves stabilization of a carbocation intermediate generated during deprotection of the polymer's acid labile groups. Particularly suitable groups that provide anchimeric assistance during acid-induced cleavage are bridged alicyclic groups, particularly optionally substituted isobornyl. Other suitable bridged acid-labile leaving groups include, but are not limited to, those prepared from fenchol, pinenol, 3,2,0 bridged-systems and 2,2,1-bridged systems. Optionally substituted heteroatom-containing groups are also preferred, particularly bridged heteroalicyclic groups such as thio- and oxo-isobornyl and norbornyl derivatives. Also preferred are acid labile groups of optionally substituted small-ring alicyclic groups, e.g. optionally substituted cycloalkylgroups having 3 or 4 ring carbon atoms such as cyclopropylmethylene and cyclobutyl. Optionally substituted alkenyl groups are also suitable, particularly allyl- and "homo-allyl"-ethers, such as alkenylethers of the formula —O(CH$_2$)$_{1\ or\ 2}$ —CH=CH$_2$ and which may be optionally substituted at available positions.

Particularly suitable leaving groups providing anchimeric assistance include optionally substituted fenchyl; optionally substituted phenyl; optionally substituted 3,2,0 bridged system; optionally substituted 2,2,1-bridged systems, optionally substituted bridged heteroalicyclic groups; and optionally substituted cycloalkyl group having 3 or 4 ring carbon atoms.

Without intending to be bound by theory, such leaving groups providing anchimeric assistance, such as isobornyl, are believed to form an intermediate during the deprotection reaction that includes a delocalized carbocation. Bridged heteroalicyclic groups as exemplified by the thionorbornyl and oxonorbornyl derivatives, again, without wishing to be bound by theory, are believed to be capable of forming a stabilized sulfonium ion derivative in the case of thio-derivatives, and a stabilized oxonium ion intermediate in the case of oxo-derivatives. It also should be appreciated that geometric relationships can be essential, e.g. the thionorbornyl group should be in the endo form to facilitate the photoacid-induced cleavage reaction.

While not intending to be bound by theory, it is believed that the relatively large steric size of the leaving group can impart high dissolution contrast upon loss of the leaving group, and that the presence of a second branch point can reduce the recombination rate of the leaving group, thereby increasing photospeed and/or reducing processing temperature (i.e. post-exposure bake temperatures).

In an alternative embodiment, one or more spacer groups, such as methyleneoxy (i.e. "—CH$_2$—O—")or two or more methyleneoxy groups, may be disposed between the aromatic oxygen and the acid cleavable or leaving group. Such spacer groups are well known in the art.

The present invention also provides a photoimageable composition including a binder polymer and a photoactive component, wherein the binder polymer includes as polymerized units one or more monomers of formula I, one or more monomers of formula II and one or more monomers of formula III (R$^1$SiO$_{3/2}$)           (I)

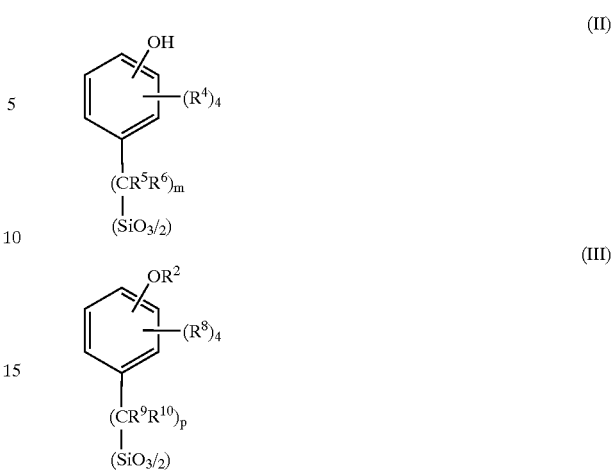

wherein R$^1$ is selected from (C$_1$–C$_{10}$)alkyl, substituted (C$_1$–C$_{10}$)alkyl, (C$_2$–C$_6$)alkenyl, substituted (C$_2$–C$_6$)alkenyl, phenyl, C$_6$(R$^7$)$_5$, (C$_1$–C$_5$)alkyl(C$_6$(R$^7$)$_4$), (C$_1$–C$_5$)alkyl (C$_6$H$_4$OZ), vinyl and substituted vinyl; Z is selected from (C1–C6)alkylsulfonate ester or arylsulfonate ester; R$^2$ is an acid cleavable group; each R$^7$ and R$^8$ is independently selected from H, F, (C$_1$–C$_6$)alkyl, (C$_1$–C$_6$)alkoxy, halo (C$_1$–C$_6$)alkyl, hydroxy-halo(C$_1$–C$_6$)alkyl and halo(C$_1$–C$_6$) alkoxy; each R$^4$ is independently selected from R$^7$ and OH; each R$^5$ and R$^9$ is independently selected from H or F; each R$^6$ and R$^{10}$ is independently selected from H, F, CH$_3$, CF$_3$, CHF$_2$, and CH$_2$F; m=0–2; and p=0–2. Particularly suitable polymers for use in positive acting photoimageable compositions are those wherein m=0 or 1. More suitable are those polymers wherein p=0 or 1, and preferably p=1.

In the present polymers, the R$^1$ group suitably lowers or helps control the dissolution rate. Thus, increasing the content of the monomers of formula I provides polymers of the present invention having decreased dissolution rate, as compared to the same polymer having a lesser amount of formula I monomers. Thus, the present invention further provides a method of controlling the dissolution rate of silicon-containing bilayer resist binders by providing an "inert" group toward base deprotection, such as the R$^1$ group of formula I monomers. Photoimageable compositions containing the present polymers show little or no loss of photospeed as compared to photoimageable compositions containing conventional silicon-containing bilayer resist polymers.

In general, the monomers of formulae I–III may be polymerized in any ratio to provide the polymers of the present invention. For example, monomers of formulae I and II may be used in any ratio of I:II from 99:1 to 1:99. Monomers of formulae I and III may be used in any ratio from of I:III from 99:1 to 1:99. When the present polymers are used in positive-acting photoimageable compositions, it is preferred that the monomers of formula III are present from 5 to 80%, based on the total molar percent of the monomers used.

The silicon-containing polymers of the present invention typically have a molecular weight of 500 to 200,000 Daltons, and preferably from 1000 to 100,000 Daltons.

It will be appreciated by those skilled in the art that more than one silicon-containing polymer may be used in the present photoimageable compositions. Thus, the present photoimageable compositions may include one, two or more silicon-containing polymers. When two or more silicon-containing polymers are used, at least one is a silicon-containing polymer of the present invention. The remaining silicon-containing polymers may be conventional silicon-containing polymers or polymers of the present invention. In this way, blends of polymers may be advantageously used in the present photoimageable compositions. Such blends include blends of the present silicon-containing polymers with non-silicon-containing polymers. In these blends, any ratio of polymers is suitable. The specific ratio will depend upon the particular polymers combined and the characteristics (dissolution rate, etch resistance, photospeed, etc.) desired and are within the ability of one skilled in the art.

A wide variety of photoactive components may be used in the present invention, including, but not limited to, photoacid generators and photobase generators. Photoacid generators are preferred. It will be appreciated by those skilled in that art that more than one photoactive component may be used advantageously in the photoimageable compositions of the present invention.

Photobase generators useful in the present invention are any compounds which liberate base upon exposure to light, typically at a wavelength of about 320 to 420 nanometers, however other wavelengths may be suitable. Suitable photobase generators include, but are not limited to: benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, and 4-(ortho-nitrophenyl)dihydropyridines.

The photoacid generators useful in the present invention are any compounds which liberate acid upon exposure to light, typically at a wavelength of about 320 to 420 nanometers, however other wavelengths may be suitable. Suitable photoacid generators include halogenated triazines, onium salts, sulfonated esters and halogenated sulfonyloxy dicarboximides.

Particularly useful halogenated triazines include halomethyl-s-triazines. Suitable halogenated triazines include for example, 2-(1-(3,4-benzodioxolyl))-4,6-bis(trichloromethyl)-1,2,5-triazine, 2-(1-(2,3-benzodioxolyl))-4,6-bis(trichloromethyl)-1,3,5-triazine, 2-(1-(3,4-benzodioxolyl))-4,6-bis(tribromomethyl)-1,3,5-triazine, 2-(1-(2,3-benzodioxolyl))-4,6-bis(tribromomethyl)-1,3,5-triazine, 2-(2-furfylethylidene)-4,6-bis(trichloromethyl)-1,3,5-triazine, 2-(2-(5-methylfuryl)ethylidene)-4,6-bis(trichloromethyl)-1,3,5-triazine, 2-(2-(4-methylfuryl)ethylidene)-4,6-bis(trichloromethyl)-1,3,5-triazine, 2-(2-(3-methylfuryl)ethylidene)-4,6-bis-(trichloromethyl)-1,3,5-triazine, 2-(2-(4,5-dimethylfuryl)ethylidene)-4,6-bis(trichloromethyl)-1,3,5-triazine, 2-(2-(5-methoxyfuryl)ethylidene)-4,6-bis(trichloromethyl)-1,3,5-triazine, 2-(2-(4-methoxyfuryl)ethylidene)-4,6-bis(trichloromethyl)-1,3,5-triazine, 2-(2-(3-methoxyfuryl)ethylidene)-4,6-bis(trichloromethyl)-1,3,5-triazine, 2-(2-(4,5-dimethoxy-furyl)ethylidene)-4,6-bis(trichloromethyl)-1,3,5-triazine, 2-(2-furfylethylidene)-4,6-bis(tribromomethyl)-1,3,5-triazine, 2-(2-(5-methylfuryl)ethylidene)-4,6-bis(tribromomethyl)-1,3,5-triazine, 2-(2-(4-methylfuryl) -ethylidene)-4,6-bis(tribromomethyl)-1,3,5-triazine, 2-(2-(3-methylfuryl)ethylidene)-4,6-bis(tribromomethyl)-1,3,5-triazine, 2-(2-(4,5-dimethoxyfuryl)ethylidene)-4,6-bis(tribromomethyl)-1,3,5-triazine, 2-(2-(5-methoxyfuryl)ethylidene)-4,6-bis(tribromomethyl)-1,3,5-triazine, 2-(2-(4-methoxyfuryl)ethylidene)-4,6-bis (tribromomethyl)-1,3,5-triazine, 2-(2-(3-methoxyfuryl)ethylidene)-4,6-bis(tribromomethyl)-1,3,5-triazine, 2-(2-(4,5-dimethoxyfuryl)ethylidene)-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924–30 (1969).

Onium salts with weakly nucleophilic anions are particularly suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts, quaternary ammonium, phosphonium and arsonium salts, aromatic sulfonium salts and sulfoxonium salts or selenium salts. Examples of suitable onium are disclosed in U.S. Pat. Nos. 4,442,197; 4,603,101; and 4,624,912, all incorporated herein by reference. Sulfonium salts such as triphenylsulfonium hexafluorophosphate are preferred.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3,337–340 (1991), incorporated herein by reference.

Suitable halogenated sulfonyloxy dicarboximides useful as photoacid generators in the present invention include, but are not limited to: 1(((trifluoromethyl)sulfonyl)oxy)-1H-pyrrole-2,5-dione; N-((perfluorooctanesulfonyl)oxy)-5-norbornene-2,3-dicarboximide; N-((trifluoromethylsulfonyl)oxy)-5-norbornene-2,3-dicarboximide; 1-(((trifluoromethyl)sulfonyl)oxy)-2,5-pyrrolidinedione; 3a,4,7,7a-tetrahydro-2-(((trifluoromethyl)sulfonyl)oxy)-4,7-methano-1H-isoindole-1,3 (2H)-dione; 2-(((trifluoromethyl)sulfonyl)oxy)-1H-benz(f)isoindole-1,3 (2H)-dione; 3,4-dimethyl-1-(((trifluoromethyl)sulfonyl)oxy)-1H-pyrrole-2,5-dione; 2-(((trifluoromethyl)sulfonyl)oxy)-1H-isoindole-1,3 (2H)-dione; 2-(((trifluoromethyl)sulfonyl)oxy)-1H-benz(de)isoquinoline-1,3(2H)-dione; 4,5, 6,7-tetrahydro-2-(((trifluoromethyl)sulfonyl)oxy)-1H-isoindole-1,3(2H)-dione; 3 a,4,7,7a-tetrahydro-2-(((trifluoromethyl)sulfonyl)oxy)-4,7-epoxy-1H-isoindole-1,3(2H)-dione; 2,6-bis-(((trifluoromethyl)sulfonyl)oxy)-benzo(1,2-c:4,5-c')dipyrrole-1,3,5,7(2H,6H)-tetrone; hexahydro-2,6-bis-(((trifluoromethyl)sulfonyl)oxy)-4,9-methano-1H-pyrrolo(4,4-g)isoquinoline-1,3,5,7(2H,3aH,6H)-tetrone; 1,8,8-trimethyl-3-(((trifluoromethyl)sulfonyl)oxy)-3-azabicyclo(3.2.1)octane-2,4-dione; 4,7-dihydro-2-(((trifluoromethyl)sulfonyl)oxy)-4,7-epoxy-1H-isoindole-1,3(2H)-dione; 3-(1-naphthalenyl)-4-phenyl-1—(((trifluoromethyl)sulfonyl)oxy)-1H-pyrrole-2,5-dione; 3,4-diphenyl-1-(((trifluoromethyl)sulfonyl)oxy)-1H-pyrrole-2,5-dione; 5,5'-(2,2,2-trifluoro-1-(triflluoromethyl)ethylidene)bis(2-(((trifluoromethyl)sulfonyl)oxy)-1H-isoindole-1,3(2H)-dione; tetrahydro-4-(((trifluoromethyl)sulfonyl)oxy)-2,6-methano-2H-oxireno(f)isoindole-3,5(1aH,4H)-dione; 5,5'-oxybis-2-(((trifluoromethyl)sulfonyl)oxy)-1H-isoindole-1,3(2H)-dione; 4-methyl-2-(((trifluoromethyl)sulfonyl)oxy)-1H-isoindole-1,3(2H)-dione; 3,3,4,4-tetramethyl-1-(((trifluoromethyl)sulfonyl)oxy)-2,5-pyrrolidinedione and mixtures thereof. It is preferred that the halogenated sulfonyloxy dicarboximides comprise one or more of 1(((trifluoromethyl)sulfonyl)oxy)-1H-pyrrole-2,5-dione; N-((perfluorooctanesulfonyl)oxy)-5-norbornene-2,3-dicarboximide; N-((trifluoromethylsulfonyl)oxy)-5-norbomene-2,3-dicarboximide and 1-(((trifluoromethyl)sulfonyl)oxy)-2,5-pyrrolidinedione, and more preferably N-((perfluorooctanesulfonyl)oxy)-5-norbomene-2,3-dicarboximide or N-((trifluoromethylsulfonyl)oxy)-5-norbornene-2,3-dicarboximide.

In positive-acting systems of the present invention, the photoactive components are typically added to photoimageable compositions in an amount sufficient to generate a latent image in a coating layer of resist material upon exposure to activating radiation. When the photoactive component is a photoacid generator, the amount is typically in the range of 0.1 to 10 percent by weight, based on the weight of the resin, and preferably 1 to 8 percent by weight.

In negative-acting systems of the present invention, the amount of photoactive component useful is any amount sufficient to catalyze cross-linking of the silicon-containing polymer or oligomer. The photoactive components are typically used in the range of 0.1 to 25% by weight, based on the weight of the composition. It is preferred that the photoactive component is present in an amount in the range of 0.1 to 15% by weight, more preferably in the range of 0.1 to 12% by weight, and still more preferably less than or equal to 5% by weight. A particularly suitable range is from 0.1 to 5% by weight.

The compositions of the present invention may optionally contain one or more organic cross-linking agents. Negative-acting systems of the present invention preferably include one or more cross-linking agents. Any aromatic or aliphatic cross-linking agent that reacts with the silicon-containing polymer or oligomer is suitable for use in the present invention. Such organic cross-linking agents will cure to form a polymerized network with the silicon-containing polymer or oligomer, and reduce solubility in selected solvents. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to: amine containing compounds, epoxy containing materials, compounds containing at least two vinyl ether groups, allyl substituted aromatic compounds, and combinations thereof. Preferred cross-linking agents include amine containing compounds and epoxy containing materials.

The amine containing compounds useful as cross-linking agents in the present invention include, but are not limited to: a melamine monomers, melamine polymers, alkylolmethyl melamines, benzoguanamine resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Particularly suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins BEETLE™ 60, 65 and 80, also available from Cytec, West Paterson, N.J. A large number of similar amine-based compounds are commercially available from various suppliers.

Melamines are the preferred amine-based cross-linkers. Particularly preferred are alkylolmethyl melamine resins. These resins are typically ethers such as trialkylolmethyl melamine and hexaalkylolmethyl melamine. The alkyl group may have from 1 to 8 or more carbon atoms but is preferably methyl. Depending upon the reaction conditions and the concentration of formaldehyde, the methyl ethers may react with each other to form more complex units.

Particularly suitable amine-based cross-linking agents include those of formula IV

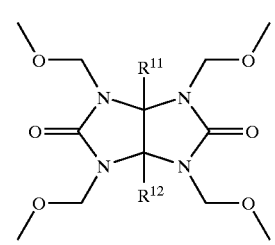

(IV)

wherein $R^{11}$ and $R^{12}$ are independently selected from H, $(C_1-C_6)$alkyl and phenyl. Preferred alkyl groups for $R^{11}$ and $R^{12}$ are methyl and propyl.

Epoxy containing materials useful as cross-linkers in the present invention are any organic compounds having one or more oxirane rings that are polymerizable by ring opening. Such materials, broadly called epoxides, include, but are not limited to: monomeric epoxy compounds, and polymeric epoxides that may be aliphatic, cycloaliphatic, aromatic or heterocyclic. Preferred epoxy cross-linking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Suitable substituents include, but are not limited to: halogens, ester groups, ethers, sulfonate groups, siloxane groups, nitro groups, phosphate groups, and the like.

Particularly useful epoxy containing materials in the present invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Such glycidyl ethers include bisphenol A epoxides, such as bisphenol A ethoxylated diepoxide. Further examples of epoxides of this type are described in U.S. Pat. No. 3,018,262, herein incorporated herein by reference to the extent this patent teaches the preparation of such epoxides.

Suitable epoxides useful in the present invention include, but are not limited to: epichlorohydrin, glycidol, glycidylmethacrylate, the glycidyl ether of p-tertiarybutylphenol (e.g., those available under the trade name EPI-REZ 5014 from Celanese); diglycidyl ether of Bisphenol A (e.g., those available under the trade designations EPON 828, EPON 1004 and EPON 1010 from Shell Chemical Co.; and DER-331, DER-332 and DER-334 from Dow Chemical Co.), vinylcyclohexene dioxide (e.g., ERL-4206 from Union Carbide Corp.), 3,4-epoxy-6-methyl-cyclohexylmethyl-3,4-epoxy-6-methylcyclohexene carboxylate (e.g., ERL-4201 from Union Carbide Corp.), bis (3,4-epoxy-6-methylcyclohexylmethyl) adipate (e.g., ERL-4289 from Union Carbide Corp.), bis(2,3-epoxycyclopentyl) ether (e.g., ERL-0400 from Union Carbide Corp.), aliphatic epoxy modified with polypropylene glycol (e.g., ERL-4050 and ERL-4269 from Union Carbide Corp.), dipentene dioxide (e.g., ERL-4269 from Union Carbide Corp.), flame retardant epoxy resins (e.g., DER-580, a brominated bisphenol type epoxy resin available from Dow Chemical Co.), 1,4-butanediol diglycidyl ether of phenolformaldehyde novolak (e.g., DEN-431 and DEN-438 from Dow Chemical Co.), and resorcinol diglycidyl ether (e.g., KOPOXITE from Koppers Company, Inc.).

Compounds containing at least two vinyl ether groups include, but are not limited to divinyl ethers of aliphatic, cycloaliphatic, aromatic or araliphatic diols. Examples of such materials include divinyl ethers of aliphatic diols having from 1 to 12 carbon atoms, polyethylene glycols, propylene glycols, polybutylene glycols, dimethylcyclohexanes, and the like. Particularly useful compounds having at least two vinyl ether groups include divinyl ethers of ethylene glycol, trimethylene-1,3-diol, diethylene glycol, triethylene glycol, dipropylene glycol, tripropylene glycol, resorcinol, Bisphenol A, and the like.

Suitable allyl substituted aromatic compounds useful as cross-linkers in the present invention are those containing one or more allyl substituents, that is, the aromatic compound is substituted at one or more ring positions by the allylic carbon of an alkylene group). Suitable allyl aromatics include allyl phenyl compounds, such as an allyl phenol. An allyl phenol crosslinker can be a monomer or polymer that contains one or more phenol units where the phenol units are substituted at one or more ring positions by an allylic carbon of an alkylene group. Typically the alkylene substituent(s) is propenyl, i.e., the phenol has one or more propenyl substituents. Preferred allyl phenols include a polycondensate of phenol and hydroxybenzaldehyde and an allylhalide such as allylchloride. A number of suitable allyl phenols are commercially available, for example the allyl phenol sold under the trade name THERMAX SH-150AR by Kennedy and Klim, Inc. (Little Silver, N.J.). Allyl phenyl compounds including allyl phenols are also described in U.S. Pat. No. 4,987,264, herein incorporated by reference to the extent this patent teaches the preparation of such compounds.

Particularly suitable organic cross-linking agents include those containing one or more methoxymethyl groups, such as methoxymethyl-substituted melamines and methoxymethyl-substituted glycourils such as those of formula IV, above. Hexamethoxymethylmelamine is a preferred methoxymethyl-substituted melamine. It is further preferred that one or more of the hydrogens of the organic cross-linking agent, and more preferably one or more of the methyl hydrogens in the methoxymethyl substituent, is substituted with a halogen, preferably fluorine. Thus, preferred cross-linkers include those containing one or more methoxyfluoromethyl and/or methoxydifluoromethyl substituents. Exemplary preferred fluorinated cross-linking agents include methoxyfluoromethyl- and methoxydifluoromethyl-substituted melamines and glycourils, such as hexamethoxyfluoromethylmelamine and hexamethoxydifluoromethylmelamine. Also suitable are fluorinated epoxy cross-linking agents. For certain applications, it is preferred that the cross-linking agent is fluorinated.

The compositions of the present invention may suitably comprise only a single type of organic cross-linker, e.g., only an amine containing cross-linker, or may contain two or more different cross-linkers. When a combination of organic cross-linkers is used in the present invention, it is preferred that the combination include an amine containing compound and an epoxy containing compound. The concentration of organic cross-linking agents in the compositions of the present invention may vary within a relatively wide range. It will be appreciated by those skilled in the art that suitable organic cross-linker concentrations will vary with factors such as cross-linker reactivity and specific application of the composition. Typically, the cross-linking agent(s) is present in an amount in the range of 0.1 to 80% by weight, based on the total weight of the composition, preferably in the range of 0.5 to 50%, and more preferably in the range of 1 to 25%. It is preferred that a cross-linking agent is used in the compositions of the present invention.

The photoimageable compositions of the present invention may optionally further include one or more additional components, including, but not limited to, solvents, anti-striation agents, plasticizers, surfactants, base additives, speed enhancers, fillers, dyes and the like. In positive-acting systems, a base additive is typically used to adjust the photospeed of the composition. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

The photoimageable compositions of the present invention may be readily prepared by those skilled in the art. For example, a photoresist composition of the invention can be prepared by dissolving the components of the photoresist, i.e. polymer binder and photoactive component, in a suitable solvent. Such suitable solvents include, but are not limited to: ethyl lactate, ethylene glycol monomethyl ether, ethylene glycol monomethyl ether acetate, propylene glycol monomethyl ether, propylene glycol monomethyl ether acetate, 3-ethoxyethyl propionate, 2-heptanone, γ-butyrolactone, and mixtures thereof.

Typically, the solids content of the photoresist composition varies from about 5 to about 35 percent by weight, based on the total weight of the composition. The resin binder and photoactive components should be present in amounts sufficient to provide a film coating layer and formation of good quality latent and relief images.

Such photoresist compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

As discussed above, the present photoimageable compositions are particularly suitable for use as a top layer in a bilayer photoresist system. As also discussed above, in such a system, a bottom layer of a conventional photoresist, such as novolac polymer based resist, inert polyarylether-sulfone copolymer based resist or a novolac or polyhydroxystyrene-based thermally cross-linkable system. Such bottom layer is typically applied to or coated on a substrate using any of the above described procedures. The bottom layer is then hard baked such as at 230° C. for 2 minutes, after which the present photoimageable compositions are coated on the cured bottom layer. The bottom layers preferably contain an amount of a UV absorbing component, such as an anthracene dye, sufficient for optical density and etch performance. The bottom layers typically have a thickness of from 0.4 to 1 $\mu$m. The top layer of the present photoimageable compositions is typically from 0.05 to 1 $\mu$m thick, preferably from 0.1 to 0.5 $\mu$m, and more preferably from 0.1 to 0.3 $\mu$m.

After being coated on the bottom layer, the present photoimageable composition top layer is dried by heating (baked) to remove any solvent. It is preferably dried until the coating is tack free. Thereafter, it is imaged through a mask in a conventional manner. The exposure is sufficient to effectively activate the photoactive component of the photoresist to produce a patterned image in the resist coating layer, and more specifically, the exposure energy typically ranges from about 1 to 100 mJ/cm$^2$, dependent upon the exposure tool and the components of the photoresist composition.

The photoimageable compositions of the present invention may be activated by a variety of exposure wavelengths, such as 248, 193, 157 nm and 11–15 nm. However, the photoimageable compositions of the present invention may be used with other radiation sources, such as, but not limited to, visible, e-beam, ion-beam and x-ray.

Following exposure, the film top layer of the composition is preferably baked at temperatures ranging from about 70° C. to 160° C. Thereafter, the top layer film is developed to form an etch pattern. The exposed resist film is rendered positive working by employing a polar developer, preferably an aqueous based developer, such as quarternary ammonium hydroxide solutions, such as tetra-alkyl ammonium hydroxide, preferably a 0.15 to 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like. One skilled in the art will appreciate which development procedures should be used for a given system.

The pattern is next transferred to the underlayer or bottom layer by etching, such as with an oxygen reactive ion etch process. After such processing, the resists, both top and bottom layers, may be removed from the processed substrate using any stripping procedures known in the art.

The present photoimageable compositions are useful in all applications where photoresists are typically used. For example, the compositions may be applied over silicon wafers or silicon wafers coated with silicon dioxide for the production of microprocessors and other integrated circuit components. Aluminum-aluminum oxide, gallium arsenide, ceramic, quartz, copper, glass, spin-on organic dielectrics, spin-on or chemical vapor deposited inorganic dielectrics, and the like are also suitable employed as substrates for the photoresist compsitions of the invention. Other chemical vapor deposited layers, such as cap layers, etch stops and the like, may also be used as substrates.

Alternatively, the present compositions may also be used in optoelectronics applications, such as in the manufacture of optical waveguides. By "optical waveguide" is meant any device that transmits optical radiation across a two-dimensional substrate surface. Suitable optical waveguides include, but are not limited to, splitters, couplers, spectral filters, polarizers, isolators, wavelength division multiplexing structures, and the like. Such waveguides may also contain active functionality, such as amplification and switching such as with electro-optic, thermo-optic or acousto-optic devices. To be useful as amplifiers, the present waveguides typically contain one or more dopants. Erbium is an exemplary dopant. Such dopants are well known in the art. Thus, the present waveguides suitable for use as amplifiers contain one or more dopants.

The waveguides of the present invention may be manufactured as individual waveguides or as an array of waveguides. Whether such waveguides are prepared as an array depends on the particular use and is within the ability of one skilled in the art.

In one embodiment, optical waveguides may be prepared by first disposing a layer of the present compositions on a substrate by any means including, but not limited to, screen coating (or screen printing), curtain coating, roller coating, slot coating, spin coating, flood coating, electrostatic spray, spray coating, dip coating or as a dry film. When the compositions of the present invention are spray coated, a heated spray gun may optionally be used. The viscosity of the composition may be adjusted to meet the requirements for each method of application by viscosity modifiers, thixotropic agents, fillers and the like. Any substrate suitable for supporting a waveguide may be used with the present compositions. Suitable substrates include, but are not limited to, substrates used in the manufacture of electronic devices such as printed wiring boards and integrated circuits. Particularly suitable substrates include laminate surfaces and copper surfaces of copper clad boards, printed wiring board inner layers and outer layers, wafers used in the manufacture of integrated circuits, liquid crystal display ("LCD") glass substrates and the like.

The coated substrate is typically then cured, such as by baking, to remove any solvent. Such curing may be a variety of temperatures, depending upon the particular solvent chosen. Suitable temperatures are any that are sufficient to substantially remove any solvent present. Typically, the curing may be at any temperature from room temperature (i.e., 25° C.) to 170° C. Such curing typically occurs over a period of from 5 seconds to 30 minutes. Such curing may be affected by heating the substrate in an oven or on a hot plate.

After curing, the layer of the present composition disposed on the substrate is then imaged by exposure to actinic radiation through appropriate artwork or a mask. Following exposure, the composition is then cured at a temperature of from 40° to 170° C. Curing time may vary but is generally from about 30 seconds to about 1 hour. While not intending to be bound by theory, it is believed that upon exposure to actinic radiation the silsesquioxane oligomer cross-links, particularly with the optional cross-linking agent. The exposed areas are rendered less soluble than the unexposed areas. Thus, the unexposed areas may be removed, such as by contact with a suitable solvent, aqueous developer or solvent-water mixture, leaving only the exposed areas remaining on the substrate. Suitable aqueous developers include alkali metal hydroxides such as sodium hydroxide and potassium hydroxide in water as well as tetraalkylammonium hydroxide in water. Such developers are typically used in concentrations from 0.1 to 0.3 N, such as 0.15 to 0.26 N tetramethylammonium hydroxide in water. The choice of developer is well within the ability of those skilled in the art. Such development may be at a variety of temperatures such as from room temperature to about 100° C. The time of such development depends upon the material to be removed and the temperature used, but is generally from about 10 seconds to about 1 hour.

Following development, the present waveguides may undergo a final cure step, or re-flow step. In such final cure step, the waveguides may be heated at a temperature in from about 130° to 225° C. in air or inert atmospheres such as nitrogen or argon. Such final cure step aids in removal of residual solvent, removal of hydroxyl groups from the silsesquioxane polymer such as by increasing the extent of cross-linking, alter the waveguide profile such as to reduce surface roughness, and improves the optical transmission properties of the material.

Optical waveguides typically have a core and a cladding, wherein the cladding has a lower index of refraction as compared to the core. Particularly useful waveguides have core having an index of refraction of from 1.4 to 1.55. Typically, suitable cladding has an index of refraction of from 1.3 to 1.54.

It is preferred that a cladding layer is first deposited on a substrate. If the cladding layer is photocurable or thermocurable, it may be blanket cured as a first step. The photodefinable core material is then deposited on the cladding layer, imaged and the unexposed areas optionally removed. A second cladding layer is then deposited on the imaged waveguide. The second cladding layer may be the same or different from the first cladding layer. However, the indices of refraction of the first and second cladding layers should be the same. The second cladding layer is then cured, or imaged in the case of a photocurable cladding composition, to provide a waveguide structure.

The silsesquioxane oligomers and polymers of the present invention are suitable for use in the cladding and/or core of the present optical waveguides. Preferably, the present photodefinable compositions are used to prepare cores for optical waveguides. It will be appreciated that the refractive index of a photodefinable composition including a present silsesquioxane oligomer and one or more organic cross-linking agents may be modified by changing the amount and type of the one or more cross-linking agents selected and/or photoactive component. Thus, the present compositions may be useful as core or cladding material depending upon the type and quantity of cross-linking agents selected.

Thus, the present invention further provides an optical waveguide having a core and a cladding, wherein at least one of the core and cladding includes as polymerized units one or more monomers of formula I and one or more monomers of formula II $$(R^1 SiO_{3/2}) \quad (I)$$

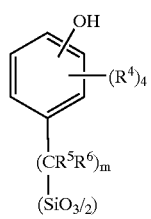

(II)

wherein $R^1$ is selected from $(C_1-C_{12})$alkyl, substituted $(C_1-C_{12})$alkyl, $(C_2-C_6)$alkenyl, substituted $(C_2-C_6)$alkenyl, phenyl, $C_6(R^7)_5$, $(C_1-C_5)$alkyl($C_6(R^7)_4$), $(C_1-C_5)$alkyl $(C_6H_4OZ)$, vinyl and substituted vinyl; Z is selected from $(C_1-C_6)$alkylsulfonate ester or arylsulfonate ester; each $R^7$ is independently selected from H, F, $(C_1-C_6)$alkyl, $(C_1-C_6)$ alkoxy, halo$(C_1-C_6)$alkyl, hydroxy-halo$(C_1-C_6)$alkyl or halo$(C_1-C_6)$ alkoxy; each $R^4$ is independently selected from $R^7$ and OH; each $R^5$ is independently selected from H or F;

each $R^6$ is independently selected from H, F, $CH_3$, $CF_3$, $CHF_2$, and $CH_2F$; and m=0–2. In yet another embodiment, the core and/or cladding material further includes as polymerized units one or more monomers of formula III

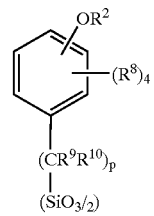

(III)

wherein $R^2$ is an acid cleavable group; each $R^8$ is independently selected from H, F, $(C_1-C_6)$alkyl, $(C_1-C_6)$alkoxy, halo$(C_1-C_6)$alkyl, hydroxy-halo$(C_1-C_6)$alkyl or halo $(C_1-C_6)$alkoxy; each $R^9$ is independently selected from H or F; each $R^{10}$ is independently selected from H, F, $CH_3$, $CF_3$, $CHF_2$, and $CH_2F$; and p=0–2. Preferred optoelectronic devices are waveguides. The present compositions are particularly suitable for use as core and/or cladding material in waveguides.

Further, the present photoimageable compositions may be used as dielectric materials, such as interlayer dielectrics in the manufacture of electronic devices, particularly integrated circuits. The dielectric constant of such dielectric material may be lowered by incorporating pores or voids into the dielectric material. Such porosity may be accomplished by a wide variety of methods, such as by the use of removable porogens or solvents. It is preferred that removable porogens, particularly cross-linked polymeric porogens, are used to impart porosity to the present photoimageable dielectric compositions. Methods of forming such porous dielectric materials are well known, such as those disclosed in European Patent Application 1 088 848 A1 (Allen et al.).

In an alternate embodiment, the present compositions may be used to make porous optoelectronic devices, such as porous core and/or cladding materials in waveguides. Such porous optoelectronic devices may be prepared according to the same methods used to prepare porous dielectric materials.

As used throughout this specification, the following abbreviations shall have the following meanings, unless the context clearly indicates otherwise: ° C.=degrees Centigrade; wt %=percent by weight; mJ=millijoules; μm=micron=micrometer; nm=nanometer; Å=angstrom; cm=centimeter; h.=hour; mL=milliliter; L=liter; N=normality; Mn=number average molecular weight; Mw=weight average molecular weight; NMR=nuclear magnetic resonance; GPC=gel permeation chromatography; Tg=glass transition temperature; RI=refractive index; g=gram; w/w=weight per weight basis; and sec=second.

"Oligomer" refers to dimers, trimers, tetramers and the like. The term "polymer" includes oligomers, dimers, trimers, tetramers and the like, and refers to both homopolymers and copolymers. The terms "cross-linker" and "cross-linking agent" are used interchangeably throughout this specification. "Resin" and "polymer" are used interchangeably throughout this specification. The term "alkyl" refers to linear, branched and cyclic alkyl. The terms "halogen" and "halo" include fluorine, chlorine, bromine, and iodine. Thus the term "halogenated" refers to fluorinated, chlorinated, brominated, and iodinated. "Fluoroalkyl" refers to both partially fluorinated and perfluorinated alkyl. The terms "acid cleavable group" and "leaving group" are used interchangeably throughout this specification.

All amounts are percent by weight and all ratios are by weight, unless otherwise noted. All numerical ranges are inclusive and combinable in any order, except where it is obvious that such numerical ranges are constrained to add up to 100%.

The following examples are presented to illustrate further various aspects of the present invention, but are not intended to limit the scope of the invention in any aspect. All documents mentioned herein are incorporated herein by reference.

EXAMPLE 1

Poly(4-hydroxybenzyl silsesquioxane) (254.7 g) is dissolved in 1000 mL dry acetone under nitrogen atmosphere in a dried 3 L flask (reactor). Methanesulfonyl chloride (23.8 g) is added and the reactor is cooled to 15° C. A solution of distilled triethylamine (21.9 g) and acetone (22 g) is gradually added dropwise over 20–30 minutes, maintaining a reaction temperature of less than 30° C. Stirring is continued for 3 hours, at which time the solution is added dropwise over 2 h. to 32 L of water, precipitating the polymer. The polymer is then collected by suction filtration, and suspended in 8 L of water with stirring at room temperature for 18 h. The solid is then collected by suction filtration, is washed with water until the effluent is pH neutral, air-dried for 48 h., and is then dried in vacuo for 24 h. at 70° C. to yield an off-white polymer, having the formula 95 mol % hydroxybenzylsilsesquioxane/5 mol % mesylatedbenzylsilsesquioxane. Yield: 246 g (85% of theory). GPC data (RI detection): Mw=6,362; Mn=3,448; molecular weight polydispersity=1.84. $T_g$=90° C. Dissolution Rate (0.26 N TMAH)=5,591 Å/sec. The resulting isolated polymer contains 5–7% methanesulfonation, as determined by $^1$H NMR.

EXAMPLE 2

A polymer with a higher mesylation level of 22% per molar equivalent of hydroxybenzyl group is prepared by the method of Example 1, except that the following reagent and solvent proportions are used: poly(4-hydroxybenzyl silsesquioxane) (63.7 g) in 250 mL dry acetone; methanesulfonyl chloride (13.8 g) in 9.3 g acetone; and triethylamine (12.6 g) in 17.4 g acetone. A 1 L reaction flask is used. Workup volumes are 8 L deionized water for precipitation, and 2 L deionized water for slurrying. The resulting polymer has the formula 78 mol % hydroxybenzylsilsesquioxane/22 mol % mesylatedbenzylsilsesquioxane. Yield: 61 g (71% of theory); GPC (RI detection): Mw=5,571, Mn=3,456; molecular weight polydispersity=1.61. $T_g$=97° C. Dissolution Rate (0.26 N TMAH)=5,591 Å/sec. The isolated polymer is typically between 21–23% methanesulfonated, as determined by $^1$H NMR and as shown by the following general formula where x=0.79–0.77 and y=0.21–0.23.

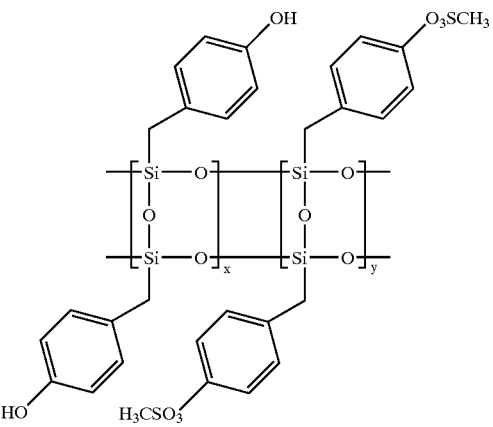

EXAMPLE 3

5% Mesylated poly(4-hydroxybenzyl silsesquioxane) (163.1 g) from Example 1 is dissolved in 750 mL dry acetone under nitrogen atmosphere in a dried 2 L flask (reactor). Di-t-butyl dicarbonate (65.5 g) is dissolved in 300 mL acetone and added to the reactor, followed by N,N-dimethylaminopyridine ("DMAP", 0.25 g) dissolved in 2 mL acetone, and the resulting pale orange solution is stirred 25° C. for 25 h. The acetone solution of polymer is added dropwise over 2 h. to 24 L of water, precipitating the polymer. The polymer is then collected by suction filtration, is washed with water, and dried in vacuo at 20° C. to constant weight (ca. 72 h.) to yield an off-white polymer, having the formula 65 mol % hydroxybenzylsilsesquioxane/5 mol % mesylatedbenzylsilsesquioxane/30 mol % tert-butoxycarbonato benzylsilsesquioxane as shown by the following general formula where x=0.65, y=0.05 and z=0.3. Yield: 174 g (90% of theory). GPC data (RI detection): Mw=6,216; Mn=3,636; molecular weight polydispersity=1.70. Dissolution Rate (0.26 N TMAH)= 0.95 Å/sec.

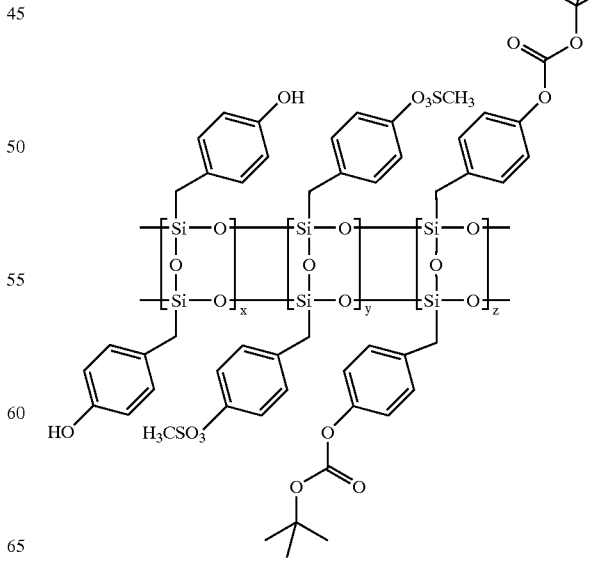

EXAMPLE 4

The method of Example 3 is repeated, except that the di-t-butyl dicarbonate charge is reduced in proportion by ⅙ (multiplied by the reaction scale). All other reagents are used in the proportions used in Example 3. The resulting polymer has the formula 70 mol % hydroxybenzylsilsesquioxane/5 mol % mesylatedbenzylsilsesquioxane/25 mol % tert-butoxycarbonato benzylsilsesquioxane. Yield (for a 58 g target batch): 50 g (87% of theory). GPC data (RI detection): Mw=6,210; Mn=3,618; molecular weight polydispersity= 1.71. Dissolution Rate (0.26 N TMAH)=63.5 Å/sec.

EXAMPLE 5

The method of Example 3 is repeated, except that the di-t-butyl dicarbonate charge is increased in proportion by ⅙ (multiplied by the reaction scale). All other reagents are used in the proportions as reported in Example 3. The resulting polymer has the formula 60 mol % hydroxybenzylsilsesquioxane/5 mol % mesylatedbenzylsilsesquioxane/35 mol % tert-butoxycarbonato benzylsilsesquioxane. Yield (for a 61 g target batch): 52 g (85% of theory). Dissolution Rate (0.26 N TMAH)=0.11 Å/sec.

EXAMPLE 6

22% Mesylated poly(4-hydroxybenzyl silsesquioxane) (61.2 g) from Example 2 is dissolved in 750 mL 1-methoxy-2-propyl acetate ("PMA"). The solution is distilled under vacuum, residual water is reduced to >0.07% w/w, and the concentration is increased to 30.61% w/w polymer in PMA (as calculated by mass balance). This distillatively dried polymer solution is then transferred to a 250 mL reaction flask under nitrogen. Trifluoroacetic acid (150 mg) in 1 mL PMA is added, followed by distilled cyclohexyl vinyl ether ("CHVE") (15.32 g), and the resulting solution is stirred for 24 h. at ambient temperature. IRA-67 anion exchange beads (25 g, available from the Rohm and Haas Company, Philadelphia, Pa.) are washed sequentially with water, acetone, and PMA, and then are added to the reaction to neutralize the acidic catalyst. The suspension is stirred for 2 h., followed by removal of the beads by filtration to yield the product polymer as a 35.39% w/w solution in PMA. The resulting polymer has the formula 43 mol % hydroxybenzylsilsesquioxane/22 mol % mesylatedbenzylsilsesquioxane/35 mol % cyclohexyloxyethyloxybenzylsilsesquioxane as shown by the following general formula where x=0.43, y=0.22 and z=0.35. Yield: 210.7 g (98% of theory). GPC data (RI detection) Mw=6,429; Mn=4,017; molecular weight polydispersity=1.60. Dissolution Rate (0.26 N TMAH)=0.23 Å/sec.

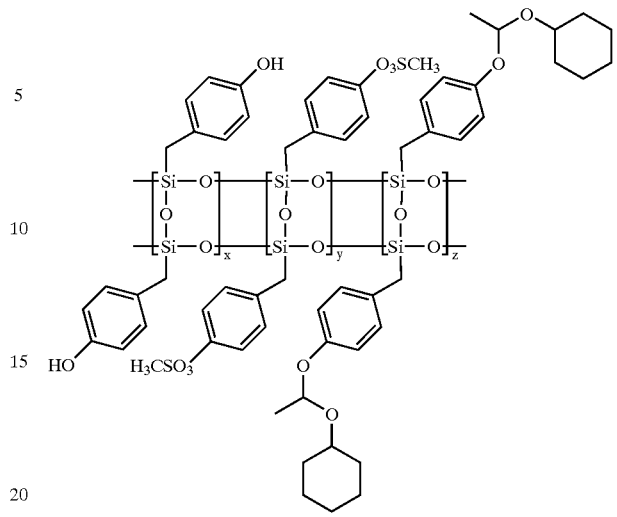

EXAMPLE 7

An imaging layer is formulated using the polymer of Example 3. A sample is prepared by combining 9.09% w/w of the polymer of Example 3, 0.85% w/w of methanoindene diimido triflate as photoacid generator, 0.051% w/w of tetrabutylammonium hydroxide, 0.02% w/w of surfactant, and 89.983% w/w of a 9:1 w/w blend of two ester solvents. This sample is spin coated on a wafer, is baked at 90° C. for 90 seconds, and is then imaged on an ASML 0.63 NA DUV stepper allowing imaging of 0.13 μm lines/spaces at a 1:1 pitch, using a Global 5-Line reticle and annular illumination (0.85 outer, 0.55 inner), with resulting photospeeds of 22.5 mJ/cm$^2$ ($E_o$) and 74 mJ/cm$^2$ ($E_{size}$). The imaged layer is shown in the Figure.

EXAMPLE 8

An imaging layer is formulated using the polymer of Example 6. A sample is prepared by combining 9.09% w/w of the polymer of Example 6, 0.85% w/w of bis(4-methylphenyl)-4-(n-octyloxyphenyl) sulfonium camphorsulfonate as photoacid generator, 0.051% w/w of tetrabutylammonium hydroxide, 0.02% w/w of surfactant, and 89.983% w/w of a 9:1 w/w blend of two ester solvents. This sample is spin coated on a wafer, is baked at 90° C. for 90 seconds, and is then imaged on an ASML 0.63 NA DUV stepper allowing imaging of 0.14 μm lines/spaces at a 1:1 pitch, using a Global 5-Line reticle and annular illumination (0.85 outer, 0.55 inner), with resulting photospeed of 9.1 mJ/cm$^2$ ($E_o$).

EXAMPLES 9–24

The following polymers are also prepared according to the general method of example 1. The polymers are reported as their polymerized units. The abbreviations in the Table have the following meanings and the general structures of the monomer units are given by formula IV: HOB—SSQ= hydroxybenzylsilsesquioxane (formula IV, W=H);

M—HOB—SSQ=mesylated HOB—SSQ or methanesulfonatobenzylsilsesquioxane (formula IV, W=CH$_3$SO$_3$—); C—HOB—SSQ=camphorsulfonatobenzylsilsesquioxane (formula IV, W=7,7-dimethyl-2-oxobicyclo[2.2.1]heptane-1-methanesulfonato); EVE—HOB—SSQ=ethyl vinyl ether blocked HOB—SSQ or ethyloxyethyloxybenzylsilsesquioxane (formula IV, W=CH$_3$CH$_2$OCH$_2$CH$_2$—); CHVE—HOB—SSQ=cyclohexyl vinyl ether blocked HOB—SSQ or cyclohexyloxyethyloxybenzylsilsesquioxane (formula IV, W=C$_6$H$_{11}$—O—CH(CH$_3$)—); and t-BOC—HOB—SSQ=tert-butoxycarbonato benzylsilsesquioxane (formula IV, W=(CH$_3$)$_3$COC(O)—). In formula IV, n is the number of repeating units and may be from 1 to 1000.

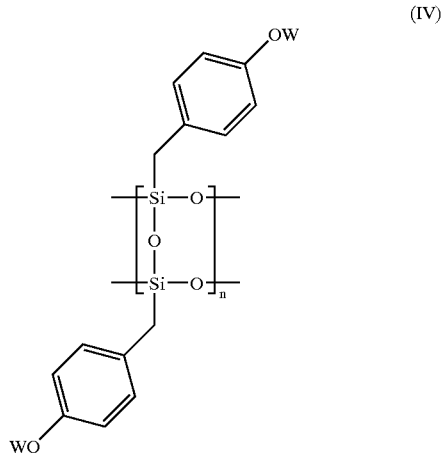

(IV)

| Example | Polymer Composition | Monomer Ratio (mol %) |
|---|---|---|
| 9 | HOB-SSQ/M-HOB-SSQ | 70/30 |
| 10 | " | 65/35 |
| 11 | " | 60/40 |
| 12 | " | 55/45 |
| 13 | " | 50/50 |
| 14 | " | 45/55 |
| 15 | HOB-SSQ/C-HOB-SSQ | 82/18 |
| 16 | " | 70/30 |
| 17 | HOB-SSQ/EVE-HOB-SSQ | 60/40 |
| 18 | " | 20/80 |
| 19 | HOB-SSQ/CHVE-HOB-SSQ | 60/40 |
| 20 | " | 20/80 |
| 21 | HOB-SSQ/M-HOB-SSQ/t-BOC-HOB-SSQ | 58/22/20 |
| 22 | " | 43/22/35 |
| 23 | HOB-SSQ/M-HOB-SSQ/CHVE-HOB-SSQ | 38/22/40 |
| 24 | " | 33/22/45 |

EXAMPLE 25

A polymer sample having a desired dissolution rate is prepared by blending a first polymer having the formula HOB—SSQ/t-BOC—HOB—SSQ in a mol % ratio of 65/35 with a second polymer having the formula HOB—SSQ/t-BOC—HOB—SSQ in a mol % ratio of 60/40, wherein the abbreviations are those used in Examples 9–24.

EXAMPLE 26

A polymer sample having a desired dissolution rate is prepared by blending a first polymer having the formula HOB—SSQ/t-BOC—HOB—SSQ in a mol % ratio of 70/5/25 with a second polymer having the formula HOB—SSQ/t-BOC—HOB—SSQ in a mol % ratio of 65/5/30, wherein the abbreviations are those used in Examples 9–24.

EXAMPLE 27

A copolymer having the composition 5% phenylsilsesquioxane/95% hydroxybenzylsilsesquioxane (155 g) is dissolved in 750 mL dry acetone under nitrogen atmosphere in a dried 2 L flask. Di-t-butyl dicarbonate (64.4 g) is dissolved in 300 mL acetone and is added to the reactor, followed by N,N-dimethylaminopyridine ("DMAP", 0.25 g) dissolved in 2 mL acetone, and the resulting pale orange solution is stirred 25° C. for 25 h. The acetone solution of polymer is added dropwise over 2 h. to 24 L of water, precipitating the polymer. The polymer is then collected by suction filtration, is washed with water, and is dried in vacuo at 20° C. to constant weight (ca. 72 h.) to yield an off-white polymer. Expected yield: 174 g (93% of theory). Dissolution rate (0.26 N TMAH) is expected to be <10 Å/sec.

EXAMPLE 28

The procedure of Example 3 is repeated, except that the di-t-butyl dicarbonate charge is reduced in proportion by ⅙ (multiplied by the reaction scale). All other reagents are used in the original proportions. Expected yield (for a 182 g target batch): 164 g (90.4% of theory). Dissolution rate (0.26 N TMAH) is expected to be approximately 80 Å/sec.

EXAMPLE 29

The procedure of Example 3 is repeated, except that the di-t-butyl dicarbonate charge is increased in proportion by ⅙ (multiplied by the reaction scale). All other reagents are used in the original proportions. Expected yield (for a 192 g target batch): 177 g (92% of theory). Dissolution rate (0.26 N TMAH) is expected to be <1 Å/sec.

EXAMPLE 30

An imaging layer is formulated using a polymer, photoacid generator, and quencher in a solvent. A typical formulation composition includes:

1) 9.09% w/w of 5% phenylsilsesquioxane/30% t-BOC HOB—SSQ/65% HOB—SSQ 2) 0.85% w/w of a photoacid generator 3) 0.051% w/w of a quencher 4) 0.02% w/w of surfactant 5) 89.983% w/w of a 9:1 w/w blend of two ester solvents
Imaging of this system on an ASML 0.63 NA DUV can yield 0.13 μm lines/spaces at a 1:1 pitch, using a Global 5-Line reticle and annular illumination (0.85 outer, 0.55 inner), with expected photospeeds of <20 mJ/cm$^2$ (E$_o$).

The foregoing description of the invention is merely illustrative thereof, and it is understood that variations and medications can be made as set forth in the following claims.

What is claimed is:

1. A positive-acting photoimageable composition comprising a photoactive component and a polymer component, the polymer component comprising a polymer that comprises Si groups and at least three distinct repeat units of: 1) units that comprise one or more photoacidlabile groups; 2) units that comprise a phenyl group that are not substituted by photoacidlabile groups or hydroxy, carboxy, or sulfonic acid moieties; and 3) units that contribute to the aqueous, alkaline developability of the composition.

2. The photoimageable composition of claim 1 wherein the one or more photoacid-labile groups comprise ester or acetal moieties.

3. A coated substrate comprising:
   a) a polymer composition coating layer applied over a substrate surface;
   b) a coating layer of a photoimageable composition of claim 2 disposed above the polymer composition coating layer.

4. A coated substrate of claim 3 wherein the polymer composition coating layer comprises a phenolic resin.

5. A method for forming a electronic device, comprising:
   (a) applying on a substrate a coating layer of a polymer composition;
   (b) above the polymer composition coating layer, applying a photoimageable composition of claim 2;
   (c) exposing the photoimageable composition coating layer to activating radiation and developing the exposed photoimageable layer.

6. The method of claim 5 wherein a coating layer of the photoimageable composition coating layer is exposed with radiation having a wavelength of about 248 nm.

7. The method of claim 5 wherein developing provides a positive tone image of the photoimageable composition.

8. The method of claim 5 wherein substrate areas bared by development are etched or plated.

9. The photoimageable composition of claim 1 wherein one or more photoacid-labile groups are linked to phenolic hydroxy groups of the polymer.

10. The photoimageable composition of claim 1 wherein units 2) comprise an unsubstituted phenyl group or phenyl group substituted with halogen, alkyl or alkoxy.

11. The photoimageable composition of claim 1 wherein units 3) comprise one or more hydroxy, carboxy or sulfonic acid moieties.

12. A positive-acting photoimageable composition comprising a photoactive component and a polymer component, the polymer component comprising a polymer that comprises Si groups and at least three distinct repeat units of: 1) units that comprise one or more photoacid-labile groups; 2) units that are free of photoacid-labile and aqueous developing groups; and 3) units that comprise a phenyl group substituted with one or more hydroxy or carboxy moieties.

13. The photoimageable composition of claim 12 wherein the one or more photoacid-labile groups comprise ester or acetal moieties.

14. A coated substrate comprising:
   a) a polymer composition coating layer applied over a substrate surface;
   b) a coating layer of a photoimageable composition of claim 13 disposed above the polymer composition coating layer.

15. A coated substrate of claim 14 wherein the polymer composition coating layer comprises a phenolic resin.

16. A method for forming a electronic device, comprising;
   (a) applying on a substrate a coating layer of a polymer composition;
   (b) above the polymer composition coating layer, applying a photoimageable composition of claim 13;
   (c) exposing the photoimageable composition coating layer to activating radiation and developing the exposed photoimageable layer.

17. The method of claim 16 wherein developing provides a positive tone image of the photoimageable composition.

18. The method of claim 16 wherein substrate areas bared by development are etched or plated.

19. The photoimageable composition of claim 12 wherein one or more photoacid-labile groups are linked to phenolic hydroxy groups of the polymer.

20. The photoimageable composition of claim 12 wherein units 3) comprise a phenyl group substituted with one or more hydroxy groups.

* * * * *